(12) United States Patent
Aggarwal et al.

(10) Patent No.: US 12,022,738 B2
(45) Date of Patent: Jun. 25, 2024

(54) METHODS FOR MANUFACTURING MAGNETORESISTIVE STACK DEVICES

(71) Applicant: Everspin Technologies, Inc., Chandler, AZ (US)

(72) Inventors: Sanjeev Aggarwal, Scottsdale, AZ (US); Sarin Deshpande, San Jose, CA (US); Kerry Nagel, Scottsdale, AZ (US); Santosh Karre, Chandler, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 450 days.

(21) Appl. No.: 17/270,151

(22) PCT Filed: Aug. 22, 2019

(86) PCT No.: PCT/US2019/047619
§ 371 (c)(1),
(2) Date: Feb. 22, 2021

(87) PCT Pub. No.: WO2020/041546
PCT Pub. Date: Feb. 27, 2020

(65) Prior Publication Data
US 2021/0328138 A1 Oct. 21, 2021

Related U.S. Application Data

(60) Provisional application No. 62/721,393, filed on Aug. 22, 2018.

(51) Int. Cl.
*H10N 50/01* (2023.01)
*H10N 50/80* (2023.01)
(Continued)

(52) U.S. Cl.
CPC ............. *H10N 50/01* (2023.02); *H10N 50/80* (2023.02); *H01F 10/3254* (2013.01); *H01F 10/3272* (2013.01); *H10B 61/00* (2023.02)

(58) Field of Classification Search
CPC .... H10N 50/01; H10N 50/80; H01F 10/3254; H01F 10/3272
See application file for complete search history.

(56) References Cited

U.S. PATENT DOCUMENTS 8,790,935 B1  7/2014 Nagel et al.
8,877,522 B2  11/2014 Nagel et al.
(Continued)

FOREIGN PATENT DOCUMENTS

CN  108232009 A  6/2018
WO  2017155508 A1  9/2017
WO  WO 2017/171840 A1  10/2017

OTHER PUBLICATIONS

Chinese Office Action dated Aug. 26, 2023 in counterpart Chinese Patent Application No. 201980058674.8 (7 pages, in Chinese).
(Continued)

*Primary Examiner* — Eduardo A Rodela
(74) *Attorney, Agent, or Firm* — Bookoff McAndrews, PLLC

(57) ABSTRACT

Fabrication of a magnetic memory element, including a via (125) in an interlevel dielectric layer (120), providing an electrical connection between an underlying metal region (110) and a magnetoresistive stack device, such as a magnetic tunnel junction (150), involves forming a transition metal layer (130) in the via by atomic layer deposition. The via optionally includes a tantalum-rich layer (140) above, and/or a cap layer (115) below, the transition metal layer, and may have a diameter less than or equal than a diameter of the magnetoresistive stack device.

20 Claims, 18 Drawing Sheets

(51) Int. Cl.
 H01F 10/32 (2006.01)
 H10B 61/00 (2023.01)

(56) References Cited

U.S. PATENT DOCUMENTS

| | | | |
|---|---|---|---|
| 9,548,442 | B2 | 1/2017 | Aggarwal et al. |
| 9,589,836 | B1 * | 3/2017 | Zhang ................... H01L 23/528 |
| 9,691,816 | B2 * | 6/2017 | Han ........................ H10B 61/00 |
| 9,711,566 | B1 | 7/2017 | Andre et al. |
| 10,205,089 | B2 * | 2/2019 | Kim ....................... H10N 50/80 |
| 10,335,200 | B2 * | 7/2019 | Jackson ............. A61B 17/7031 |
| 10,504,959 | B2 * | 12/2019 | Bak ........................ H10B 61/22 |
| 10,862,023 | B2 * | 12/2020 | Peng ....................... H10N 50/10 |
| 10,966,649 | B2 * | 4/2021 | Fukuda .................. A61B 5/282 |
| 11,088,204 | B2 * | 8/2021 | Pillarisetty ........... G11C 13/004 |
| 2011/0089511 | A1 | 4/2011 | Keshtbod et al. |
| 2014/0284737 | A1 * | 9/2014 | Kumura ................ H10B 61/22 |
| | | | 257/421 |
| 2014/0287536 | A1 | 9/2014 | Nagel et al. |
| 2015/0325622 | A1 | 11/2015 | Zhang et al. |
| 2020/0006639 | A1 * | 1/2020 | Wu ................... H01L 21/28562 |

OTHER PUBLICATIONS

International Search Report and Written Opinion in International Application No. PCT/US2019/047619, dated Dec. 13, 2019 (26 pages).

\* cited by examiner

METHODS FOR MANUFACTURING MAGNETORESISTIVE STACK DEVICES

CROSS-REFERENCE TO RELATED APPLICATIONS

This application is the U.S. national phase entry under 35 U.S.C. § 371 of International Application No. PCT/US2019/047619, filed on Aug. 22, 2019, which claims the benefit of priority from U.S. Provisional Application No. 62/721,393, filed on Aug. 22, 2018, each of which is incorporated by reference herein in its entirety.

TECHNICAL FIELD

The present disclosure relates to, among other things, methods and apparatus for integrating semiconductor devices. More particularly, embodiments of the present disclosure are directed to methods and apparatus for integrating magnetoresistive devices.

INTRODUCTION

The present disclosure generally relates to magnetoresistive devices having a magnetoresistive stack or structure (for example, part of a magnetoresistive memory device, magnetoresistive sensor/transducer device, etc.) and methods of integrating the described magnetoresistive devices. In one embodiment, an exemplary magnetoresistive stack (for example, one using a magnetic tunnel junction (MTJ)) of the present disclosure may be integrated with other exemplary magnetoresistive stacks through the use of a via comprising one or more layers deposited by atomic layer deposition (ALD), including selective ALD.

Briefly, a magnetoresistive stack used in a memory device (e.g., a magnetoresistive random access memory (MRAM)) includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information may be stored in the magnetoresistive memory stack by switching, programming, and/or controlling the direction of magnetization vectors in the magnetic layer(s) of the "free" magnetic region. The direction of the magnetization vectors of the "free" magnetic region may be switched and/or programmed (for example, through spin orbit torque (SOT) or spin transfer torque (STT)) by application of a write signal (e.g., one or more current pulses) adjacent to, or through, the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state. The magnetic regions on either side of the non-magnetic layer forms a magnetic tunnel junction (MTJ) when the non-magnetic layer is a dielectric material. The MTJ has different electrical resistances in the first and second magnetic states. For example, a resistance of the second magnetic state may be relatively higher than a resistance of the first magnetic state. The magnetic state of the magnetoresistive memory stack is determined or read based on the resistance of the stack in response to a read current applied, for example, through the magnetoresistive stack.

Read currents and write currents are applied to the stack through a series of lines or metal layers, e.g., metal layer 1 (M1), metal layer 2 (M2), and/or metal layer 3 (M3), and vias interconnecting an MTJ to M1, M2, and/or M3. The field of MTJ devices has been trending towards smaller MTJs and MTJ devices, and relatively more memory devices made of such MTJs, thereby creating a need for relatively smaller vias (e.g., a diameter less than or equal to 100 nm) and methods of effectively fabricating small vias to facilitate higher density of cells (e.g., a more dense memory component).

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1A:
Figure 1B:
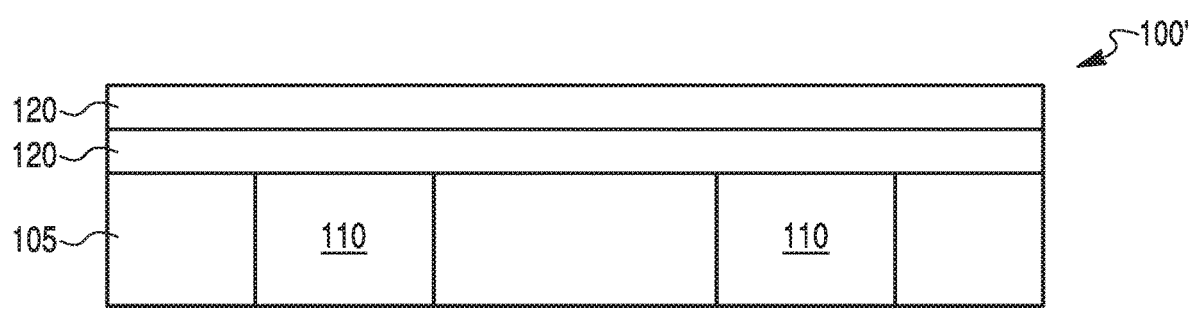
Figure 1C:
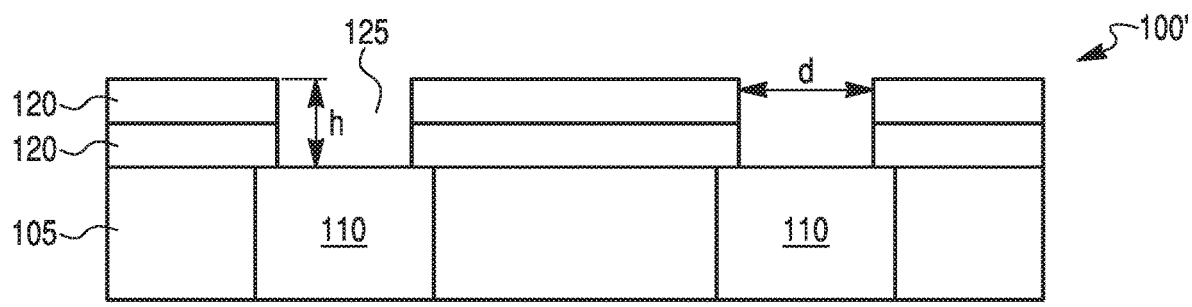
Figure 3A:
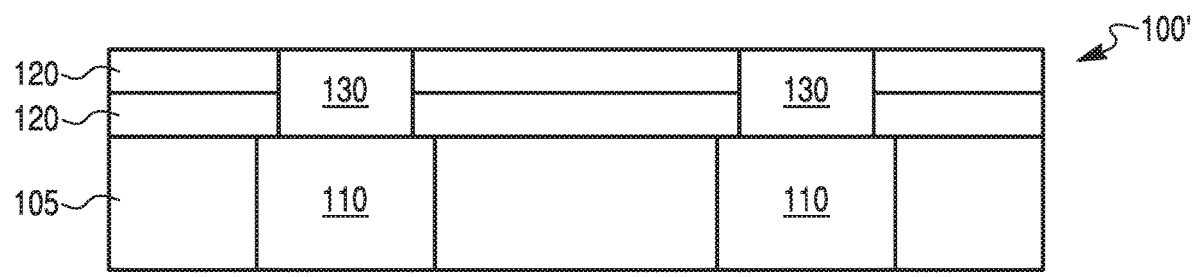
Figure 3B:
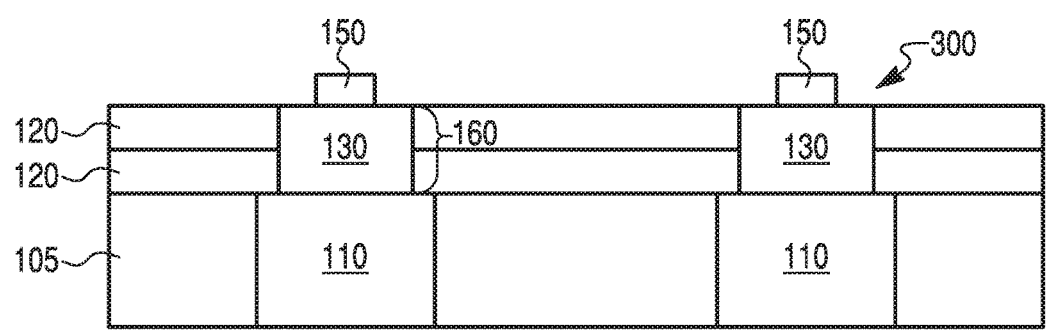
Figure 5A:
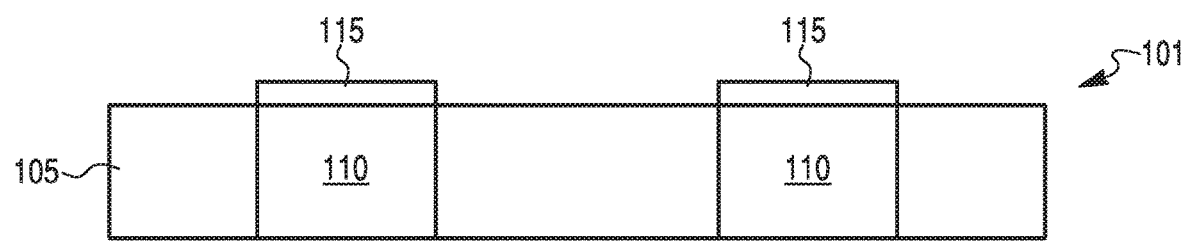
Figure 5B:
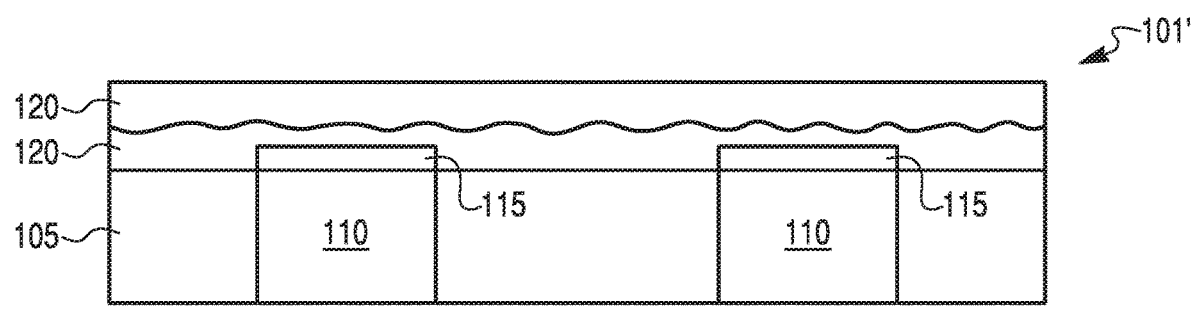
Figure 5C:
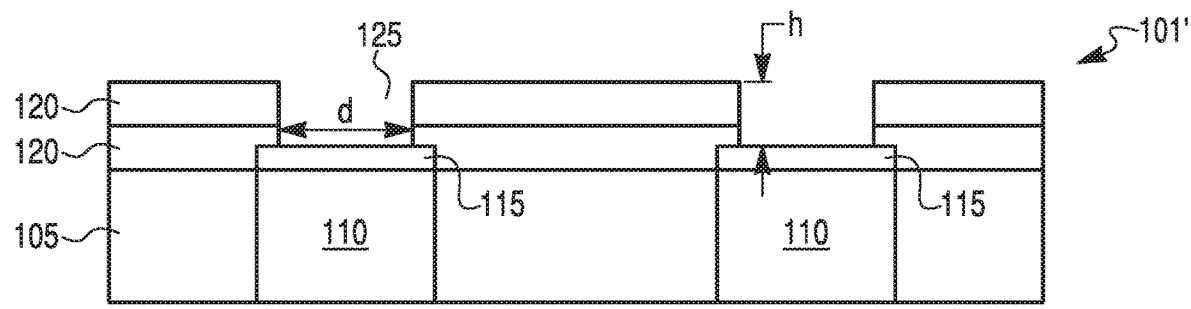
Figure 7A:
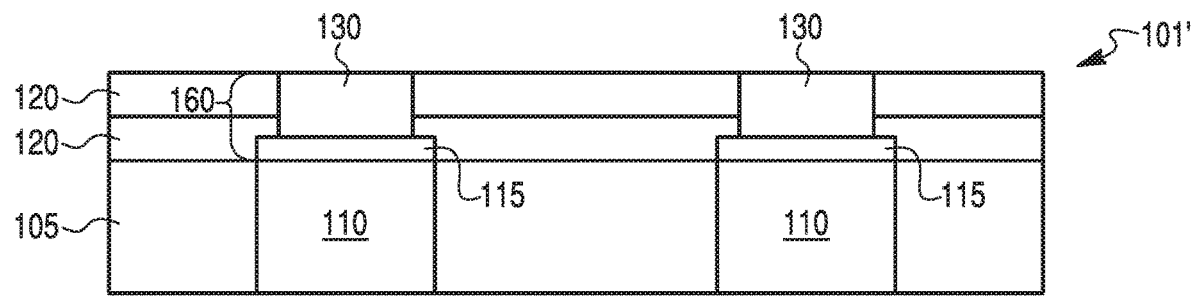
Figure 7B:
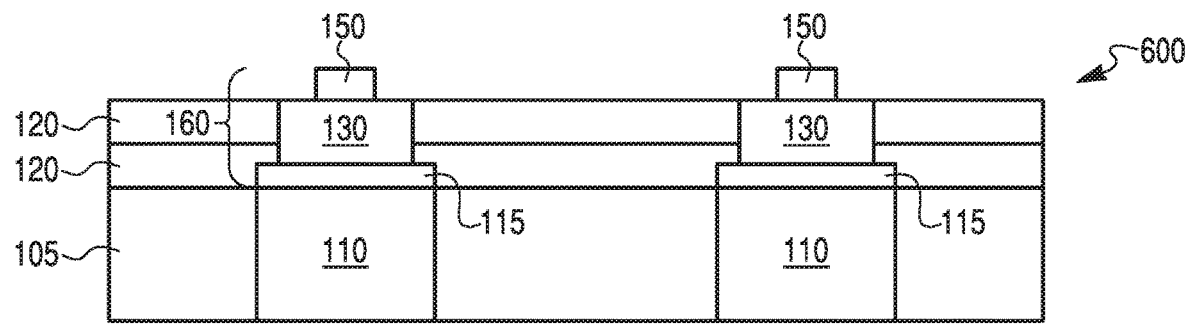
Figure 9A:
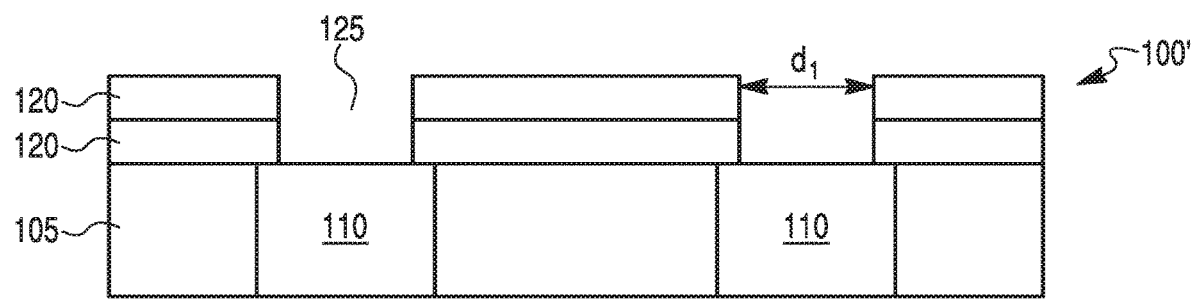
Figure 9B:
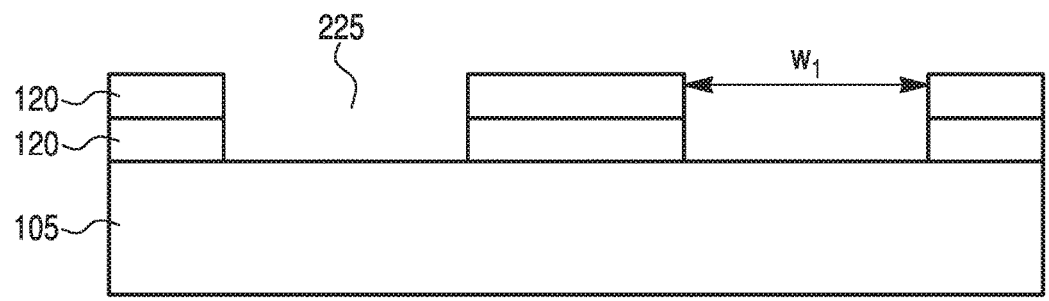
Figure 10A:
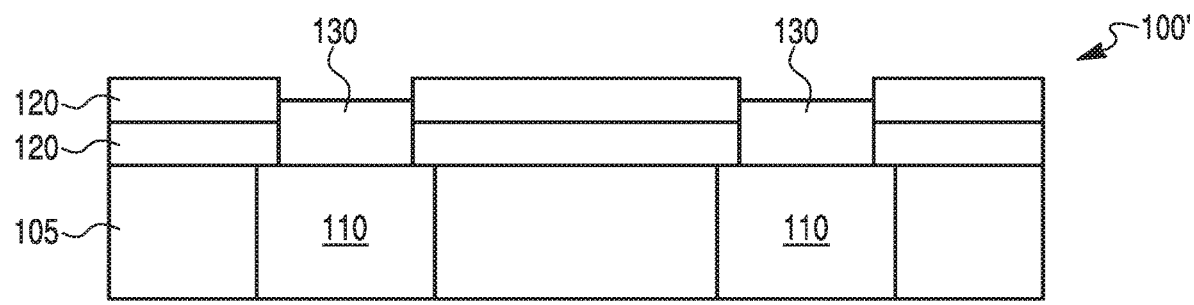
Figure 10B:
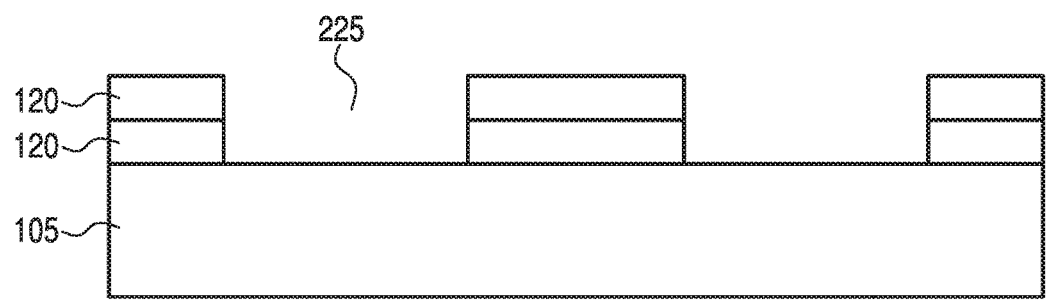
Figure 11A:
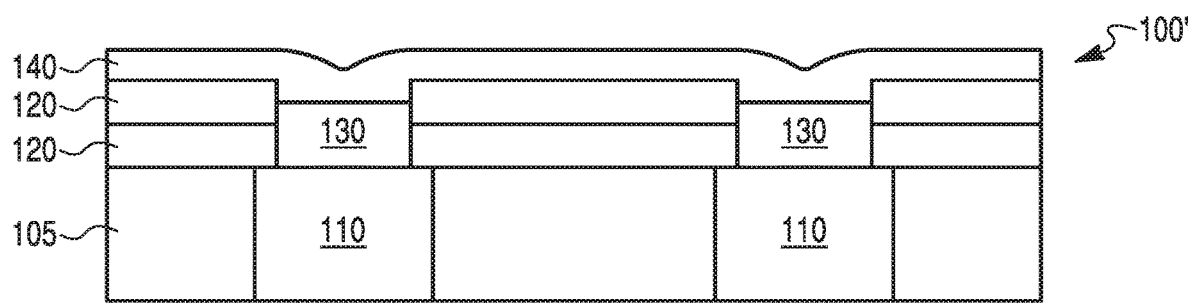
Figure 11B:
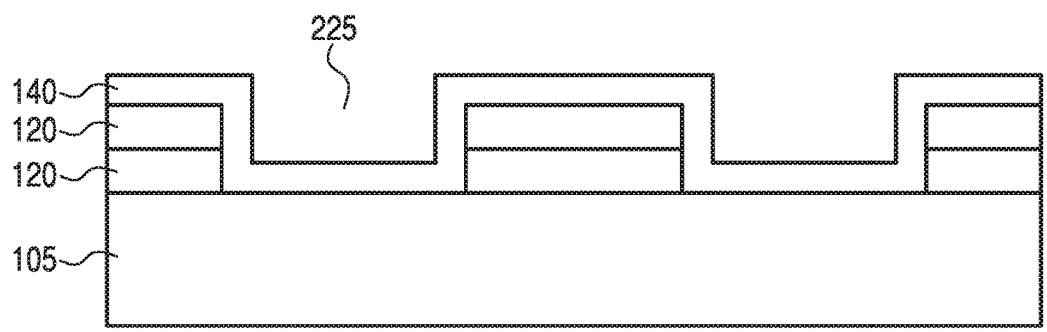
Figure 12A:
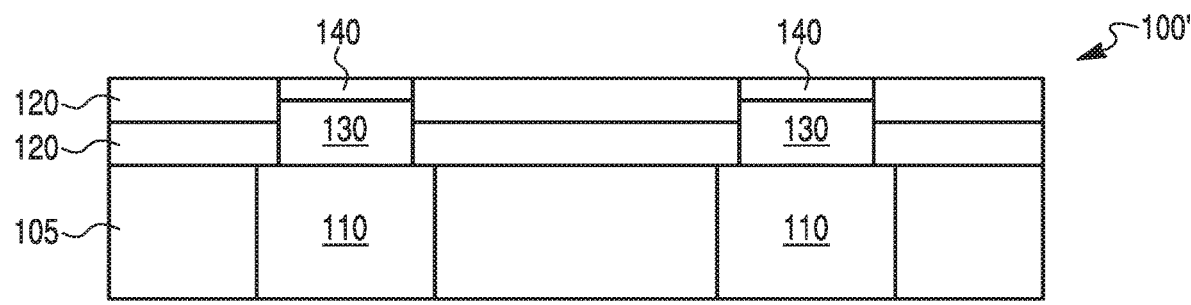
Figure 12B:
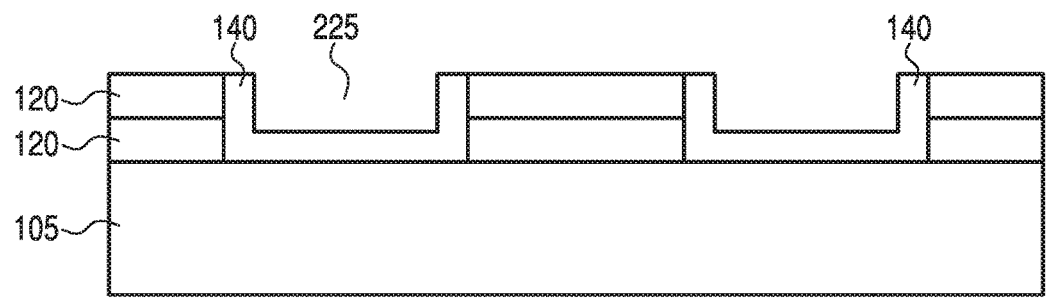
Figure 13A:
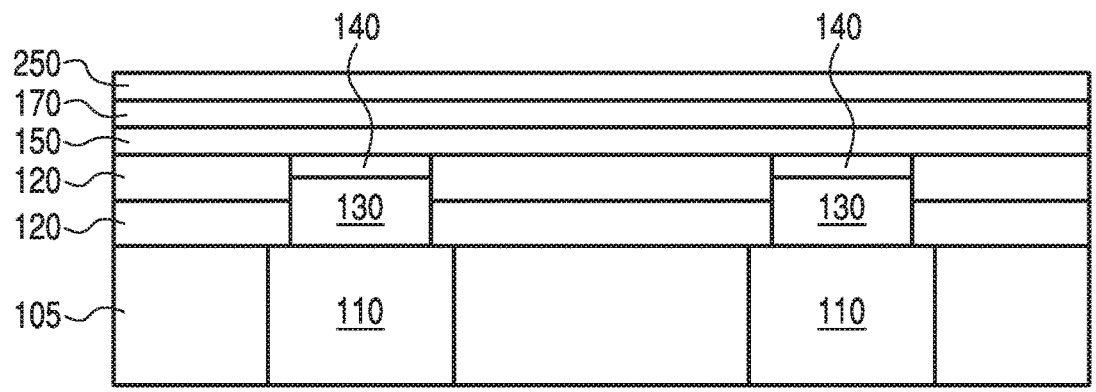
Figure 13B:
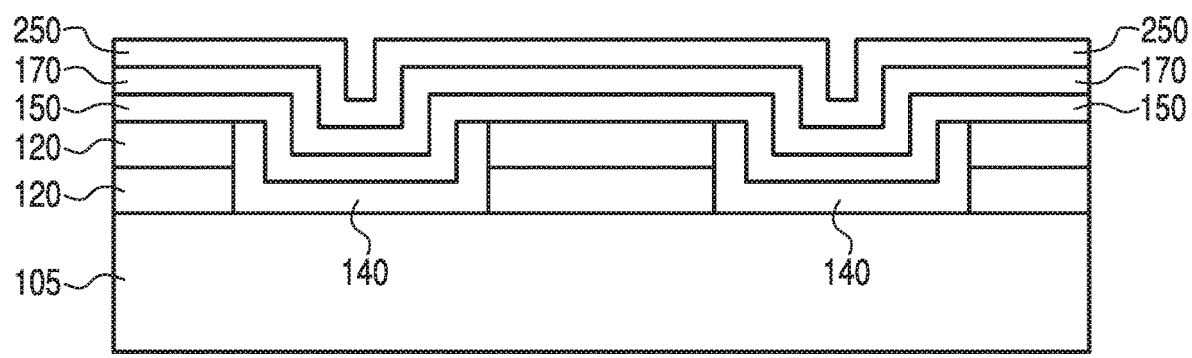
Figure 14:
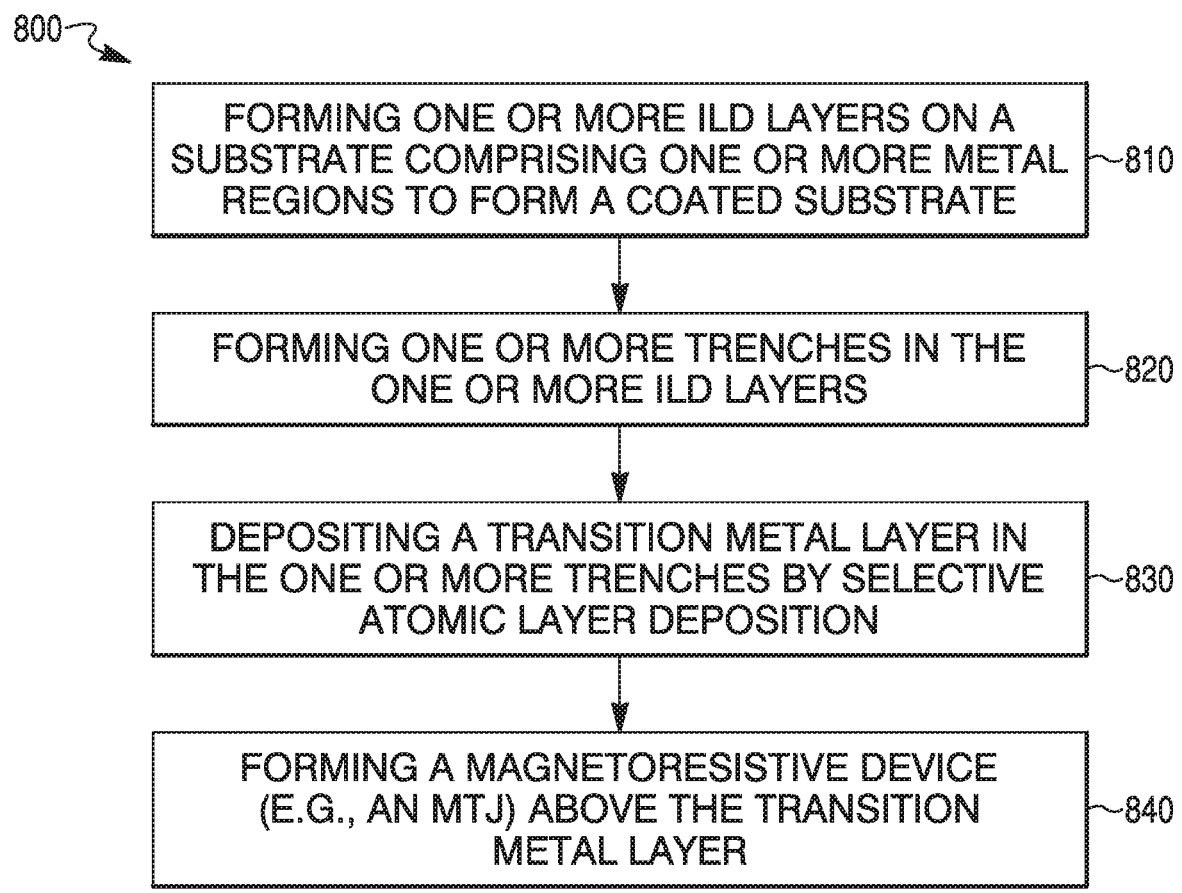
Figure 15:
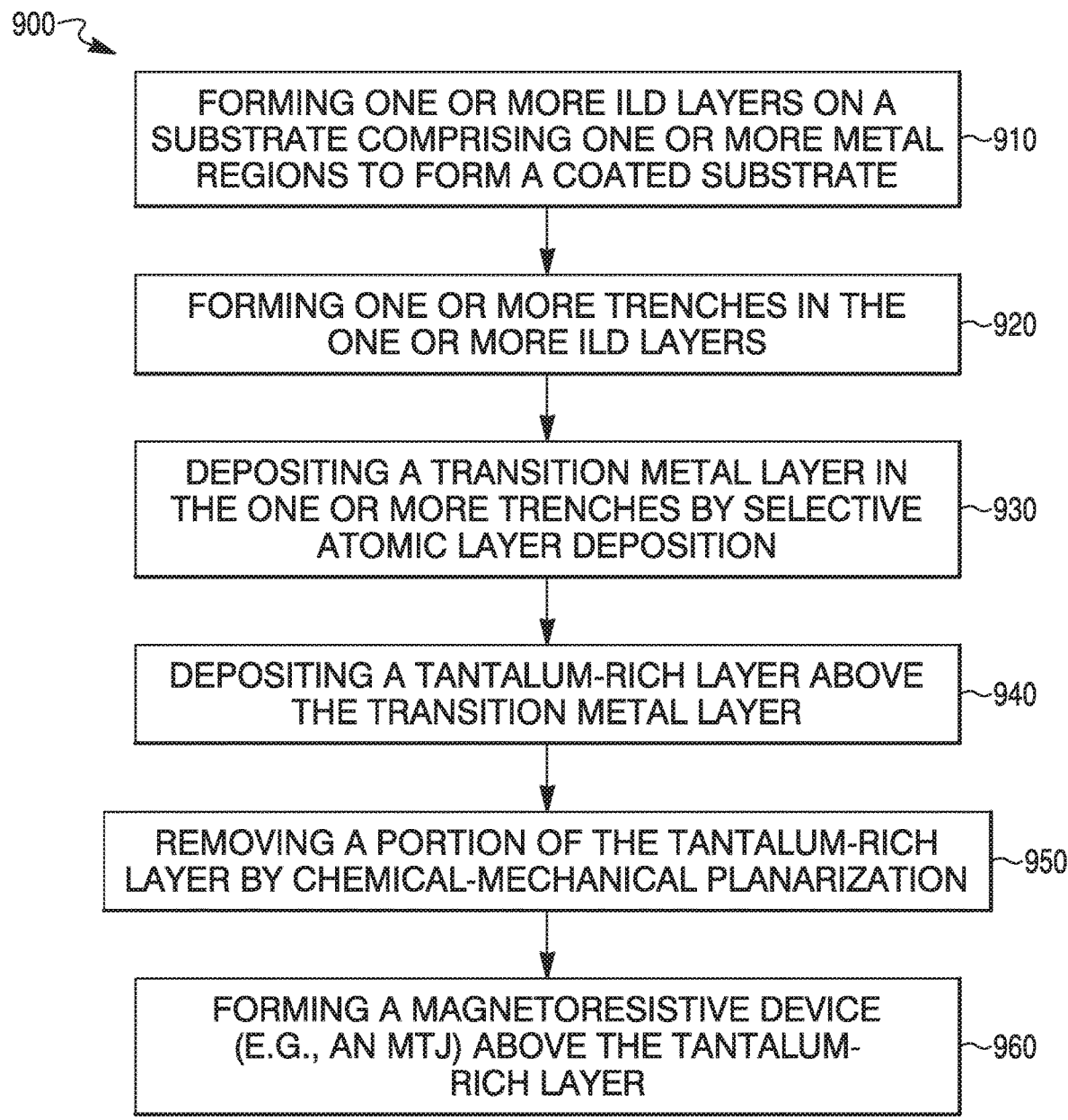
Figure 16:
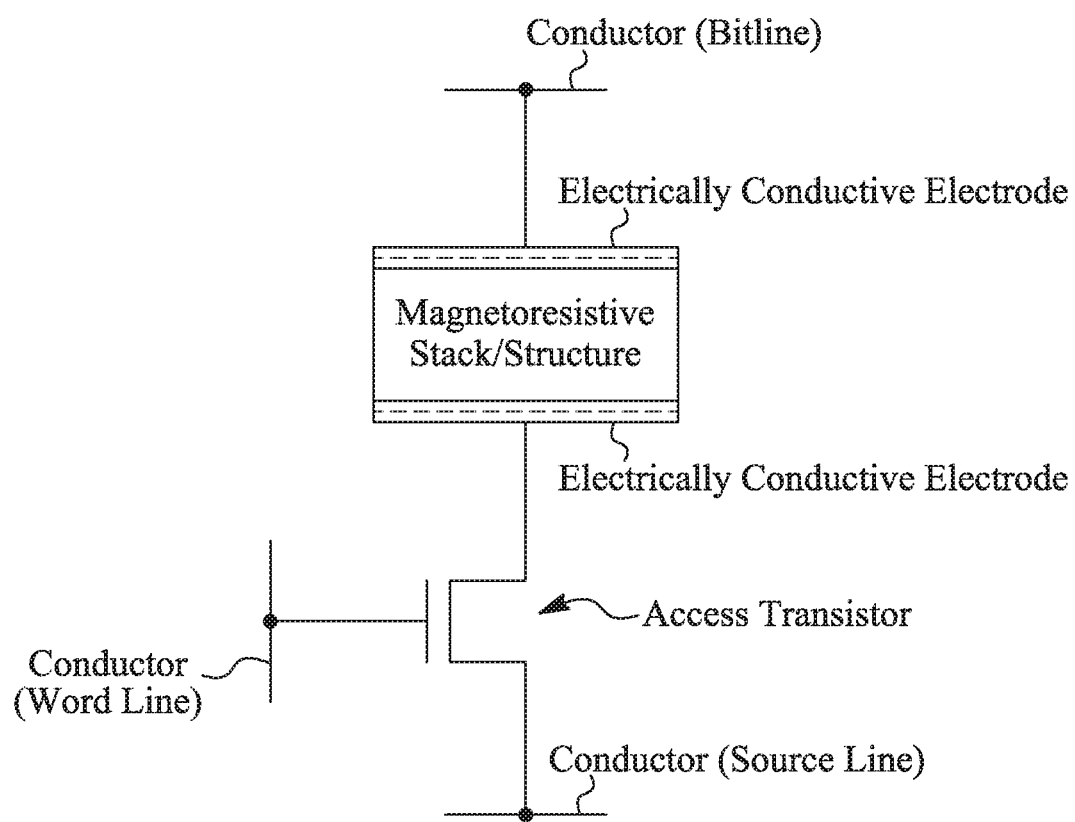
Figure 17A:
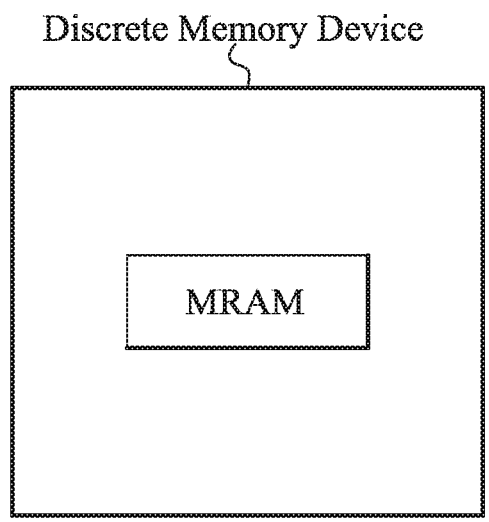
Figure 17B:
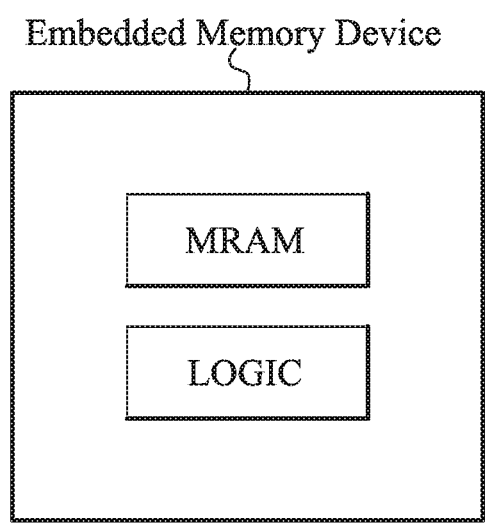

FIGS. 1A-1C illustrate cross-sectional views depicting various regions of an exemplary substrate, according to one or more embodiments of the present disclosure;

FIGS. 2A-2D illustrate cross-sectional views depicting exemplary layers formed on or above the exemplary substrate of FIGS. 1A-1C, according to one or more embodiments of the present disclosure;

FIGS. 3A-3B illustrate cross-sectional views depicting exemplary layers formed on or above the exemplary substrate of FIGS. 1A-1C, according to another embodiment of the present disclosure;

FIGS. 4A-4D illustrate cross-sectional views depicting exemplary layers formed on or above the exemplary substrate of FIGS. 1A-1C, according to a still further embodiment of the present disclosure;

FIGS. 5A-5C illustrate cross-sectional views depicting various regions of exemplary substrates having certain layers formed thereon, according to yet another embodiment of the present disclosure;

FIGS. 6A-6D illustrate cross-sectional views depicting exemplary layers formed on or above the exemplary substrate of FIGS. 5A-5C, according to another embodiment of the present disclosure;

FIGS. 7A-7B illustrate cross-sectional views depicting exemplary layers formed on or above the exemplary substrate of FIGS. 5A-5C, according to a still further embodiment of the present disclosure;

FIGS. 8A-8D illustrate cross-sectional views depicting exemplary layers formed on or above the exemplary substrate of FIGS. 5A-5C, according to yet another embodiment of the present disclosure;

FIG. 9A illustrates a cross-sectional view depicting exemplary layers formed on or above the exemplary substrates of FIGS. 1A-1C, according to one or more embodiments of the present disclosure;

FIG. 9B illustrates a cross-sectional view depicting exemplary layers formed on or above one or more substrates described herein, according to another embodiment of the present disclosure;

FIG. 10A illustrates a cross-sectional view depicting exemplary layers formed on or above the exemplary substrates of FIGS. 1A-1C, according to yet another embodiment of the present disclosure;

FIG. 10B illustrates a cross-sectional view depicting exemplary layers formed on or above one or more substrates described herein, according to a still further embodiment of the present disclosure;

FIG. 11A illustrates a cross-sectional view depicting exemplary layers formed on or above the exemplary substrates of FIGS. 1A-1C, according to one or more embodiments of the present disclosure;

FIG. 11B illustrates a cross-sectional view depicting exemplary layers formed on or above one or more substrates described herein, according to another embodiment of the present disclosure;

FIG. 12A illustrates a cross-sectional view depicting exemplary layers formed on or above the exemplary substrates of FIGS. 1A-1C, according to yet another embodiment of the present disclosure;

FIG. 12B illustrates a cross-sectional view depicting exemplary layers formed on or above one or more substrates described herein, according to a still further embodiment of the present disclosure;

FIG. 13A illustrates a cross-sectional view depicting exemplary layers formed on or above the exemplary substrates of FIGS. 1A-1C, according to one or more embodiments of the present disclosure;

FIG. 13B illustrates a cross-sectional view depicting exemplary layers formed on or above one or more substrates described herein, according to another embodiment of the present disclosure;

FIG. 14 is a flow chart illustrating an exemplary fabrication process for integrating a plurality of magnetoresistive devices, according to one or more embodiments of the present disclosure;

FIG. 15 is a flow chart illustrating an exemplary fabrication process for integrating a plurality of magnetoresistive devices, according to one or more embodiments of the present disclosure;

FIG. 16 is a schematic diagram of an exemplary magnetoresistive memory stack electrically connected to a select device, e.g., an access transistor, in a magnetoresistive memory cell configuration; and FIGS. 17A-17B are schematic block diagrams of integrated circuits including a discrete memory device and an embedded memory device, each including an MRAM (which, in one embodiments is representative of one or more arrays of MRAM having a plurality of magnetoresistive memory stacks according to aspects of certain embodiments of the present disclosure).

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc.

are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a "fixed" magnetic region. For the sake of brevity, the discussions and illustrations presented in this disclosure will not be repeated specifically in the context of GMR or other magnetoresistive stacks/structures, but the discussion and drawings described below are to be interpreted as being entirely applicable to GMR and other magnetoresistive stacks/structures.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive devices may be referred to by specific names (e.g., metal layer 1 (M1), metal layer 2 (M2), capping region, reference region, transition region, etc.), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a first region of a via may be depicted as being "below" a second region, in some aspects the entire depicted region may be flipped such that the first region is "above" the second region.

As is known in the art, an electrical resistance of the described MTJs may change based on whether the magnetization direction (e.g., the direction of the magnetic moment) of the "free" region adjacent to the non-magnetic layer (e.g., a tunnel barrier) is in a parallel alignment or in an antiparallel alignment with the magnetization direction (e.g., the direction of the magnetic moment) of the "fixed" region adjacent to the non-magnetic layer. Typically, if the two regions have the same magnetization alignment, the resulting relatively low resistance is considered as a digital "0," while if the alignment is antiparallel the resulting relatively higher resistance is considered to be a digital "1." A memory device (such as an MRAM) may include multiple such magnetoresistive (MTJ) stacks, which may be referred to as memory cells or elements, arranged in an array of columns and rows. By measuring the current through each cell, the resistance of each cell, and thus the data stored in the memory array can be read.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of integrating magnetoresistive devices, such as, e.g., one or more MTJ stacks. As will be described in greater detail below, embodiments of the present disclosure relate to the creation of vias including suitable electrically conductive material and configured to allow for the bidirectional transfer of current from a metal layer 1 (M1), metal layer 2 (M2), or metal layer 3 (M3) layer to an MTJ or other suitable magnetoresistive stack/structure.

In some embodiments, the disclosed magnetoresistive stacks may be formed between a top electrode/via/line and a bottom electrode/via/line and, which permit access to the stack by allowing for connectivity (for example, electrical) to circuitry and other elements of the magnetoresistive device. Between the electrodes/vias/lines is an MTJ comprising multiple regions, including at least one "fixed" magnetic region and at least one "free" magnetic region with one or more intermediate region(s), such as, e.g., a dielectric layer (that form(s) a tunnel barrier) between the "fixed" and "free" magnetic regions. Each of the "fixed" and "free" magnetic regions may include, among other things, a plurality of ferromagnetic layers. In some embodiments, the stack may be formed between two vias connecting the stack to two different metal layers. More particularly, an MTJ (or other suitable magnetoresistive stack) of the present disclosure may be formed in between a via connecting the MTJ to metal layer 1 (M1) and another via connecting the MTJ to another metal layer, e.g., metal layer 2 (M2).

Generally, the vias of the present disclosure are "on-axis" vias that may be constructed by the application of additional layers or regions onto a substrate. The substrate may comprise one or more metal regions (e.g., metal layer 1 (M1), metal layer 2 (M2), or metal layer 3 (M3)) disposed, e.g., in silica. The one or more metal regions (e.g., metal regions 110 in FIG. 1A) may comprise cobalt (Co), ruthenium (Ru), alloys comprising Co and/or Ru, other transition metals, or alloys of one or more transition metals. Additional layers may be added by physical vapor deposition (PVD), chemical vapor deposition (CVD), or any other technique known in the art. In some embodiments, layers may be physically or chemically altered after they are applied. These alterations may include polishing, etching, oxidizing, or other processes known in the art.

Referring now to FIG. 1A, an exemplary substrate 100 is shown comprising one or more metal regions 110 disposed in a silica base 105, according to one or more embodiments of the present disclosure. Those of ordinary skill in the art will readily recognize that the metal regions may be referred to as the metal layer 1 (M1) or metal layer 2 (M2). As shown in FIG. 1B, one or more interlevel dielectric (ILD) layers 120 (e.g., interlayer dielectric layers) may be applied to a surface of the substrate 100 forming a coated substrate 100'. The ILD layers 120 may include any suitable material, including, but not limited to, silicon nitride (e.g., $Si_3N_4$, SiN), silicon oxide (e.g., $SiO_x$), carbon doped silicon dioxide, other carbon doped oxides, organo silicate glass, alumina, magnesium oxides, tetraethoxysilane, or combinations thereof. In some embodiments, each of the ILD layers 120 may comprise the same or similar material. In other embodiments, at least one of the ILD layers 120 includes a material that is different from other ILD layers 120.

After formation, each ILD layer 120 may be chemically or physically polished, abraded, or otherwise processed to remove a portion of the applied layer and create a uniform surface. In one or more embodiments, this polishing, abrading, or processing may involve chemical-physical planarization (CMP), a process of smoothing surfaces that uses one or more abrasive and/or corrosive chemical slurries in combination with a polishing surface. In some embodiments, at least one ILD layer 120 (e.g., the first ILD layer 120 to be deposited) is not physically or chemically polished, abraded, or otherwise processed prior to the application of a subsequent ILD layer 120. For clarity, the remaining drawings may show underlying ILD layers 120 as being chemically or physically polished. However, it should be understood that embodiments involving the application of successive ILD layers 120 without intervening polishing or other processing steps also is contemplated.

After one or more ILD layers 120 have been applied (e.g., deposited or otherwise formed) to a substrate 100 to form a coated substrate 100', regions above metal regions 110 may be etched to form one or more trenches 125 in the ILD layers 120 above metal regions 110, each trench 125 having height, h, and a diameter, d, as shown in FIG. 1C. In one or more embodiments, the metal regions 110 of coated substrate 100' may include metal layer 1 (M1) and/or metal layer 2 (M2). Trenches 125 may have a diameter less than or equal to approximately 100 nm. In other embodiments, trenches 125 may have a diameter of approximately 5 nm to approximately 75 nm, of approximately 5 nm to approximately 50 nm, of approximately 5 nm to approximately 40 nm, of approximately 5 nm to approximately 30 nm, of approximately 10 nm to approximately 30 nm, of approximately 10 nm to approximately 25 nm, of approximately 15 nm to approximately 25 nm, or of approximately 15 nm to approximately 20 nm. In some embodiments, the diameter of trench 125 may be less than the diameter of the associated metal region 110. In other embodiments, trench 125 may have a diameter greater than or equal to the diameter of the associated metal region 110. Trench 125 may have a height, h, of approximately 5 nm to approximately 100 nm. In other embodiments, trench 125 may have a height of approximately 5 nm to approximately 75 nm, of approximately 10 nm to approximately 50 nm, of approximately 10 nm to approximately 40 nm, of approximately 10 nm to approximately 35 nm, of approximately 15 nm to approximately 40 nm, of approximately 15 nm to approximately 35 nm, or of approximately 20 nm to approximately 35 nm. In one or more embodiments, trenches 125 may have an aspect ratio (e.g., a ratio of height to diameter (h:d)) less than or equal to 2. In other embodiments, trenches 125 may have an aspect ratio less than or equal to 1.5, less than or equal to 1, less than or equal to 0.9, or less than or equal to 0.8.

The coated substrate 100' may be etched by any suitable etching process. For example in some embodiments, reactive ion etching (RIE) or ion beam etching (IBE) may be used to etch through ILD layers 120 to form trench 125. As known to those of ordinary skill in the art, IBE and RIE use beams of charged ions (e.g., reactive charged ions comprising one or more of argon (Ar), krypton (Kr), xenon (Xe), or similar ion source) to etch through the one or more ILD layers 120 to form trench 125. As also known to those of ordinary skill in the art, in some cases, etching trenches 125 may include multiple steps (e.g., photolithography, etc.) that are not described herein. During RIE or IBE, the impact of ions may ablade portions of ILD layers 120 to form trench 125. During this process, some of the ablated material may redeposit on the sidewalls of trench 125. In some cases, this redeposited layer may affect the electrical and/or magnetic performance of the eventually formed via. Therefore, in some embodiments, during or after the etching process, any redeposited material may be cleaned or otherwise removed from the sidewalls of trench 125 by using processes, such as, for example, angled etch, isotropic etch, or other suitable etching techniques. In some embodiments, this cleaning step may be eliminated or performed on only select portions of sidewalls of trench 125. Moreover, in some embodiments, the formation of trench 125 may include multiple alternating etching and cleaning steps to form a trench of height h that exposes a surface of metal region 110.

Various methods of forming a via within one or more trenches 125 of a coated substrate 100' will now be described. Although various embodiments will be discussed, it should be understood that aspects of one embodiment may be combined with aspects of another embodiment without departing from the intended scope of the present disclosure.

Referring to FIGS. 2A-2D, one or more transition metals or transition metal alloys may be deposited into a trench 125 of a coated substrate 100' to form a transition metal layer 130. In some embodiments, it is contemplated that the material deposited into a trench 125 may be the same as, similar to, or corresponding in one more characteristics to the material of metal region(s) 110. More specifically, if the material of metal region 110 is ruthenium (Ru), the material of transition metal layer 130 also may be ruthenium (Ru). Similarly, if the material of metal region 110 is cobalt (Co), the material of transition metal layer 130 also may be cobalt (Co). Still further, if the material of metal region 110 is ruthenium (Ru), the material of transition metal layer 130 may be cobalt (Co), and vice versa. In this manner, the material of transition metal layer 130 may correspond in one more characteristics to the material of metal regions 110. With specific reference to FIG. 2A, a transition metal layer 130 is deposited in a trench 125, contacting the metal region 110 and leaving an unfilled region of the trench 135. The transition metal layer 130 has the same diameter as the trench 125 whose space it at least partially occupies. The transition metal layer 130 may have a height less than or equal to the height of the previously formed trench 125. The transition metal layer 130 may comprise cobalt (Co), ruthenium (Ru), alloys comprising Co and/or Ru, other transition metals, or alloys of one or more transition metals. The term "transition metal layer," as used herein, is a term that is not meant to denote a connotation that the layer includes, exclusively or inclusively, one or more transition metal layers. For example, transition metal layer 130 may comprise aluminum (Al). In one or more embodiments, the transition metal layer 130 has the same, or similar, composition as the metal region 110 which it contacts. In other embodiments, the transition metal layer 130 differs in composition from the metal region 110 which it contacts.

The transition metal layer 130 may be deposited by ALD (e.g., selective ALD), selective area deposition (SAD), or other type of chemical vapor deposition. In selective ALD, one or more materials may be selectively deposited in a sequential, organized, and/or self-limiting reaction. The materials used in an ALD process may generally be referred to as precursors. In one or more embodiments heat or electromagnetic energy may be used to drive or limit one or more chemical reactions of the ALD process. ALD, specifically selective ALD, is an advantageous process for depositing the transition metal layer 130 because the transition metal that constitutes the layer 130 may be deposited selectively on only metal region 110 and/or to only a desired height of a trench 125. The limiting chemical reactions of a selective ALD process prevent the transition metals from being deposited either on an ILD layer 120 or being deposited unevenly within the trench 125.

In conventional methods of making vias, difficulties arise in attempting to fill trenches 125, especially trenches 125 having the diameter and height characteristics as those described herein (e.g., trenches 125 having relatively small aspect ratios). Often such conventional fills may have to be resputtered, forming a seam in the via. When vias or one or more constituent layers of a via include a seam, electrical conductivity is not uniform throughout the via and structural damage may result to the via. Electrical performance of such vias also may be compromised. In some embodiments, filling one or more regions by ALD (e.g., selective ALD) may enable the formation of a via without a seam.

Figure 2A:
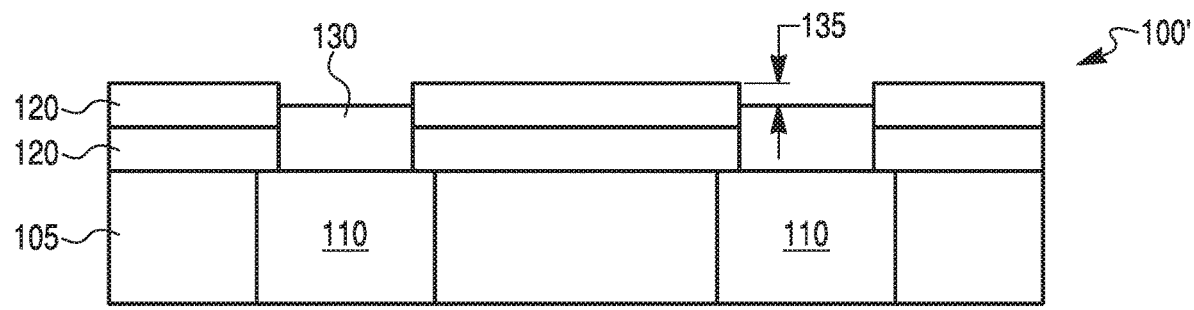
Figure 2B:
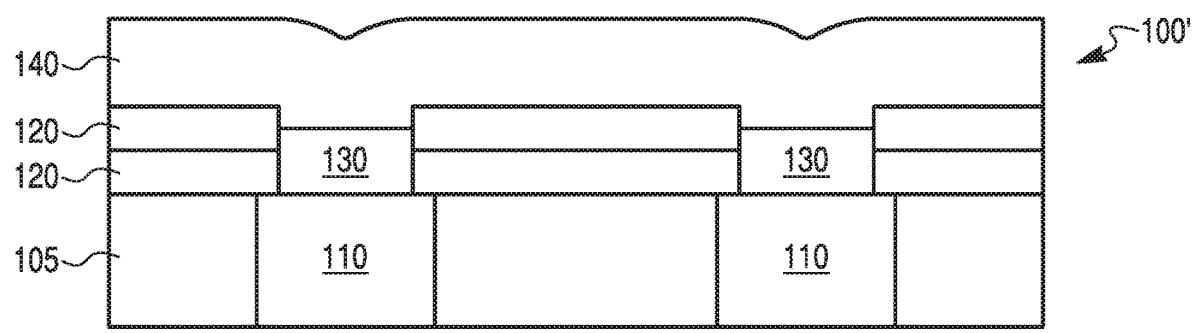

Referring to FIG. 2B, after a transition metal layer 130 is deposited on a metal region 110 within a trench 125, leaving behind unfilled region of the trench 135, a tantalum-rich layer 140 may be deposited on top of the transition metal layer 130 and ILD layers 120. In some embodiments, the tantalum-rich layer 140 may be applied as a conformal coating or layer. The tantalum-rich layer 140 may comprise tantalum (Ta), tantalum nitride (TaN), or other compounds including Ta. In one or more embodiments, tantalum-rich layer 140 comprises greater than or equal to approximately 25 percent Ta by atomic percentage (at. %). In other embodiments, tantalum-rich layer 140 comprises greater than or equal to approximately 35 at. % Ta, greater than or equal to approximately 50 at. % Ta, greater than or equal to approximately 60 at. % Ta, greater than or equal to approximately 70 at. % Ta, or even greater than or equal approximately 80 at. % Ta.

After tantalum-rich layer 140 is deposited (depicted in FIG. 2B), the portion of tantalum-rich layer 140 over the ILD layers 120, in addition to the portion of layer 140 that extends past the top surface of the top ILD layer 120, may be polished, abraded, or otherwise removed by chemical or physical means. As those of ordinary skill in the art will recognize, the selective removal of the tantalum-rich layer 140 may require moving the substrate to another tool. In one or more embodiments, the previously described portion of tantalum-rich layer 140 is removed by CMP, leaving the material of tantalum-rich layer 140 only within trenches 125, as described in greater detail below.

Figure 2C:
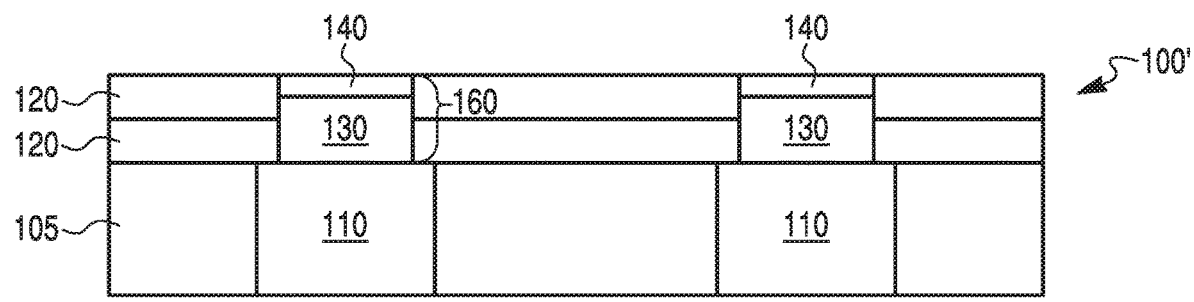

After the top portion of tantalum-rich layer 140 is removed, only the portion of the tantalum-rich layer 140 that resides in the previously formed trench 125, between walls of ILD layers 120 remains, as shown in FIG. 2C. This remaining tantalum-rich layer 140 may be in contact with the transition metal layer 130 and flush with the top surface of the top ILD layer 120. In one or more embodiments, tantalum-rich layer 140 and transition metal layer 130 constitute and define a via 160, as shown in FIGS. 2C-2D.

Figure 2D:
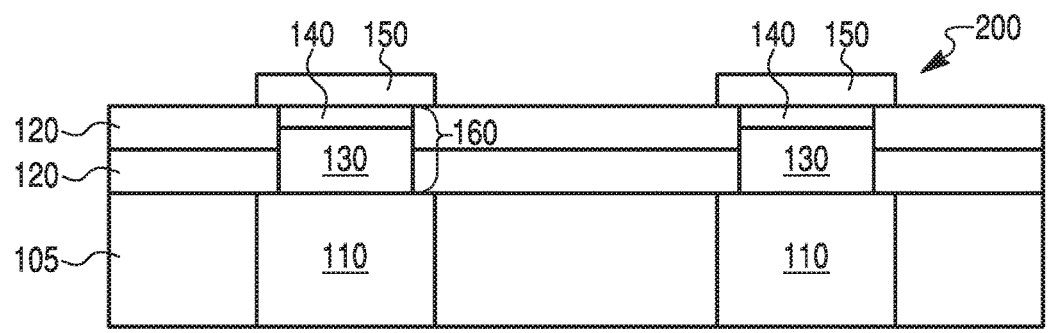

After the top portion of tantalum-rich layer 140 is removed, an MTJ 150 may be placed (e.g., deposited and/or patterned) on tantalum-rich layer 140, forming a magnetoresistive stack 200, as shown in FIG. 2D. The tantalum-rich layer 140 may facilitate seating of the MTJ 150 on the via 160, thereby improving electrical performance and structural integrity. MTJs 150 are known in the art and have been previously described. As it is contemplated that vias 160 of the present disclosure may be used with any number of MTJ stacks and/or magnetoresistive devices, further description of exemplary MTJs 150 is omitted for the sake of brevity. Current may flow bidirectionally from metal region 110 to MTJ 150 through the via 160 (e.g., through each of the transition metal layer 130 and tantalum-rich layer 140). In one or more embodiments, the MTJ 150 may include a diameter greater than or equal to the diameter of tantalum-rich layer 140. In other embodiments, MTJ 150 may have a diameter less than the diameter of tantalum-rich layer 140. In some embodiments, peripheral portions MTJ 150 may also contact one or more ILD layers 120. In one or more embodiments, the via 160 may be co-axial with MTJ 150 and/or metal region 110.

FIGS. 3A-3B depict another exemplary method for fabricating a via between a metal region 110 and an MTJ 150 from a coated substrate 100', according to one or more embodiments of the present disclosure. Referring to FIG. 3A, a transition metal layer 130 may be deposited within trenches 125 of a coated substrate 100' (as shown in FIG. 1C). In one or more embodiments, such as the one depicted in FIG. 3A, transition metal layer 130 may completely fill trench 125, contacting all ILD layers 120 and associated metal region 110. That is, the transition metal layer 130 may be deposited until it is substantially or completely flush with an outermost surface of coated substrate 100'. In some embodiments, transition metal layer 130 is deposited by an ALD process, e.g., a selective ALD process.

After transition metal layer 130 is deposited in one or more trenches 125, an MTJ 150 may be provided directly on top of transition metal layer 130, forming a magnetoresistive stack 300, as depicted in FIG. 3B. MTJ 150 may have a diameter less than or equal to the diameter of transition metal layer 130. In some embodiments, MTJ 150 may have a diameter greater than or equal to the diameter of transition metal layer 130. Current may pass bidirectionally from MTJ 150 to metal region 110, through transition metal layer 130. In embodiments like those depicted in FIG. 3B, the via 160 consists only of transition metal layer 130. That is, in such embodiments, the MTJ 150 is provided directly on (and in contact) with transition metal layer 130, thereby eliminating the need for a bottom electrode (e.g., the tantalum-rich layer 140). In these embodiments, the processes for creating the via 160 and providing MTJ 150, including deposition and/or patterning of the MTJ layers, may be conducted within a single tool or chamber.

Figure 4A:
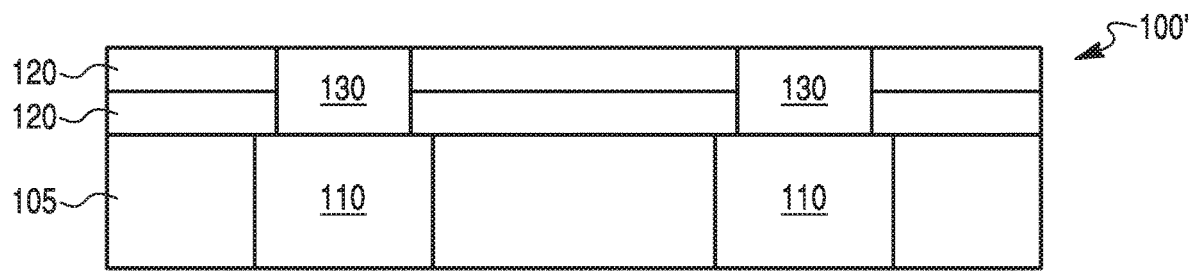

FIGS. 4A-4D depict another exemplary method for fabricating a via between a metal region 110 and an MTJ 150 from a coated substrate 100', according to one or more embodiments of the present disclosure. Referring to FIG. 4A, a transition metal layer 130 may be deposited within trenches 125 of a coated substrate 100' (as shown in FIG. 1C). In one or more embodiments, such as the one depicted in FIG. 4A, transition metal layer 130 occupies a substantial entirety of the height and diameter of the trench 125, contacting all ILD layers 120 and associated metal region 110. That is, it is contemplated that transition metal layer 130 may completely fill trench 125 and be substantially or completely flush with an outermost layer of coated substrate 100'. In some embodiments, transition metal layer 130 is deposited by ALD and, more particularly, a selective ALD process.

Figure 4B:
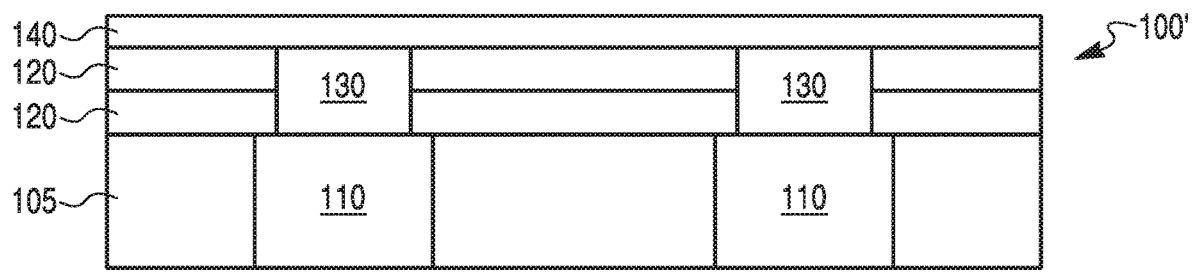
Figure 4C:
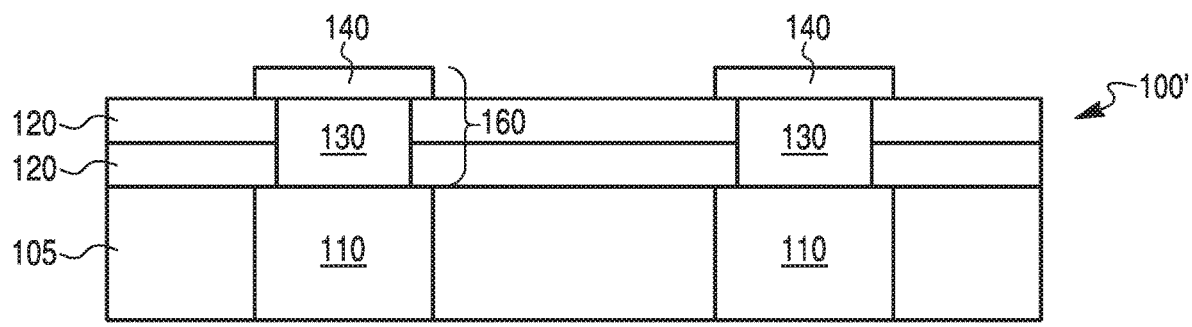
Figure 4D:
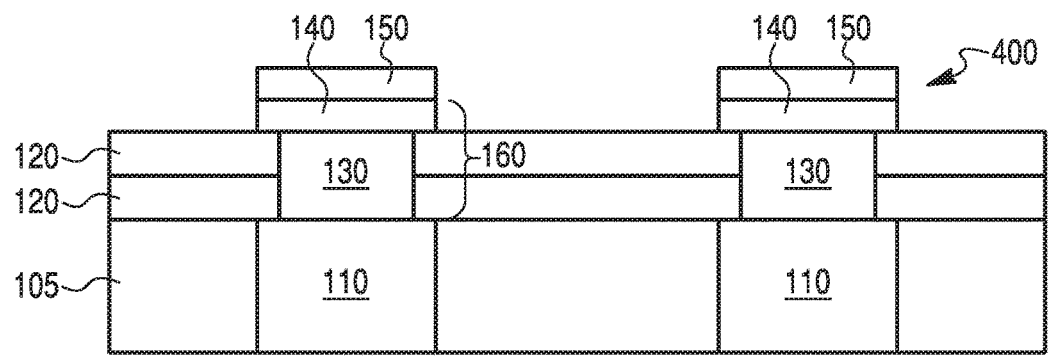

After transition metal layer 130 is deposited in one or more trenches 125 of a coated substrate 100', a tantalum-rich layer 140 may be selectively applied on top of transition metal layer 130 such that it contacts transition metal layer 130 and one or more ILD layers 120, forming a via 160. That is, as shown in, e.g., FIG. 4B, a tantalum-rich region 140 may be deposited or otherwise provided an entire surface of coated substrate 100'. In some embodiments, one more processes (such as, e.g., IBE or RIE) may be undertaken to remove the tantalum-rich layer 140 covering certain portions of ILD layer 120. As shown in FIG. 4C, the tantalum-rich layer 140 may be removed from all portions of ILD layer 120 except those portions immediately adjacent to trench 125. In these embodiments, the coated substrate 100' may be moved to another tool for the removal of select portions of the tantalum-rich layer 140. However, this is not a requirement. Instead, in some embodiments, it may be undesirable to move the coated substrate 100' to a different tool for the removal processes. Thus, the tantalum-rich layer 140 may remain over the transition metal layer 130 and the surfaces of ILD 120, as shown in FIG. 4B. As a result, a via 160 is formed comprising transition metal layer 130 and tantalum-rich layer 140. The via 160 may have a constant diameter or the diameter of the via may vary along its height. In one or more embodiments, the tantalum-rich layer 140 may have a diameter greater than or equal to the diameter of the transition metal layer 130. In other embodiments, the tantalum-rich layer 140 may have a diameter less than the diameter of the transition metal layer 130.

An MTJ 150 then may be formed on top of the via 160 (e.g., on top of tantalum-rich layer 140 of FIG. 4B), providing a means for current to pass bidirectionally from MTJ 150 to metal region 110, the current passing through the via 160 (e.g., passing through both the tantalum-rich layer 140 and the transition metal layer 130). In some embodiments, it is contemplated that the tantalum-rich layer 140 may be deposited or otherwise provided in situ within the chamber/tool intended to carry out the formation (i.e., deposition and patterning) of the MTJ 150. Stated differently, in such embodiments, the coated substrate 100' is not removed or otherwise transported from one tool to another tool (i.e., chamber) in between application of the tantalum-rich layer 140 and formation of the MTJ 150.

In one or more embodiments, the trench 125 etched in the ILD layers 120 of a coated substrate 100' may not extend all the way to a metal region 110. In some embodiments, such as those depicted in FIGS. 5A-C, a cap layer 115 is added over the metal regions 110 of a substrate 100 prior to the application of the ILD layers 120, then a trench 125 is etched in the ILD layers 120, which can later be filled to form a via 160 connecting an MTJ 150 to a metal region 110 through the cap layer 115. As those of ordinary skill in the art will recognize, the cap layer 115 may be deposited over the entire surface of substrate 100 and metal regions 110 (e.g., metal layer 3 (M3) and then removed from portions of substrate 100 to leave cap layer 115 only over the metal regions 110. Alternatively, the cap layer 115 may be deposited only over metal regions 110.

Referring briefly back to FIG. 1A, a substrate 100 comprises one or more metal regions 110 and a silica base 105, as previously described. A cap layer 115 may be added over the one or more metal regions 110 by any physical vapor deposition or chemical vapor deposition method known in the art forming a capped substrate 101, as shown in FIG. 5A. The cap layer 115 may comprise cobalt (Co), ruthenium (Ru), iron (Fe), copper (Cu), other transition metals, or alloys or combinations thereof. In one or more embodiments, the composition of cap layer 115 may be the same as (or similar to) the composition of the associated (or underlying) metal region 110. In some embodiments, the composition of cap layer 115 may differ from the composition of the associated or underlying metal region 110 of capped substrate 101.

Referring to FIG. 5B, in one or more embodiments, after cap layer 115 has been applied to one or more metal regions 110, and, optionally, removed from adjoining surface of substrate 100, one or more ILD layers 120 may be applied, as previously described, to form a coated capped substrate 101'. As noted previously, each ILD layer 120 may be chemically or physically polished, abraded, or otherwise processed (e.g. by a CMP process or the like) to remove a portion of the applied layer and/or create a uniform surface. In other embodiments, such as the embodiment depicted in FIG. 5B, at least one ILD layer 120 is not physically or chemically polished, abraded, or otherwise processed prior to the application of a subsequent ILD layer 120. For clarity, the remaining drawings may show underlying ILD layers 120 as being chemically or physically polished. However, it should be understood that embodiments involving the application of successive ILD layers 120 without intervening polishing or other processing steps is also contemplated.

After one or more ILD layers 120 are applied, one or more trenches 125 having a height, h, and diameter, d, may be etched in the ILD layers 120, as shown in FIG. 5C. Any etching process previously described or known in the art may be used. The properties and dimensions of the trenches 125 (e.g., values of h and d) of coated capped substrate 101' are similar to those of the trenches 125 of coated substrate 100'. As shown in FIG. 5C, the trench 125 may be etched to a depth that exposes a surface of cap layer 115. In one or more embodiments, the metal region 110 of a coated capped substrate 101' is an M3 region, which may include any suitable material, including, e.g., Copper (Cu).

Figure 6A:
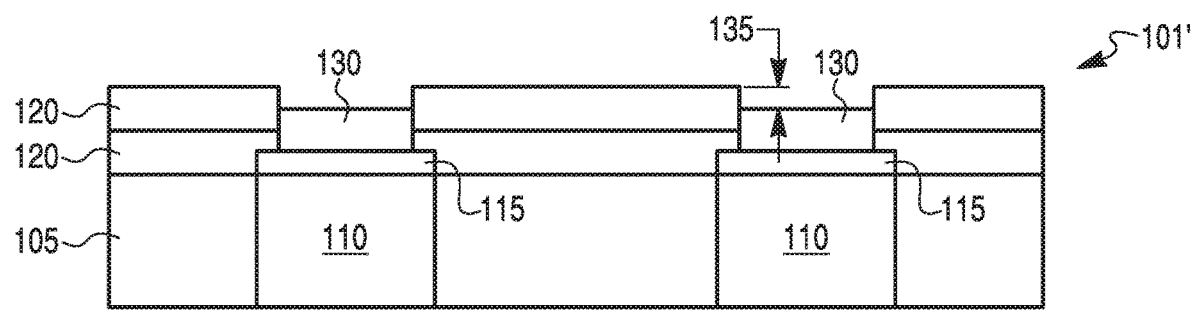

In one or more embodiments, such as those depicted in FIG. 6A, a transition metal layer 130 is deposited in trench 125, contacting the cap layer 115 and leaving an unfilled region 135 of the trench 125. The transition metal layer 130 has the same diameter as the trench whose space it at least partially occupies. The transition metal layer 130 may have a height less than or equal to the height of trench 125. The transition metal layer 130 may comprise cobalt (Co), ruthenium (Ru), alloys comprising cobalt (Co) and/or ruthenium (Ru), other transition metals, or alloys of one or more transition metals. In one or more embodiments, the transition metal layer 130 has the same, or similar, composition as the cap layer 115 which it contacts. In other embodiments, the transition metal layer 130 differs in composition from the cap layer 115 which it contacts. In some embodiments, the transition metal layer 130 may be deposited by ALD.

Figure 6B:
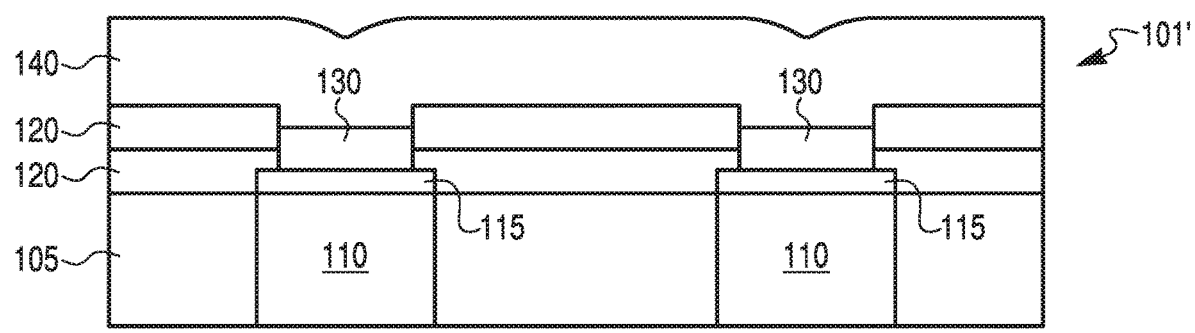

Referring to FIG. 6B, after a transition metal layer 130 is deposited on a metal region 110 within a trench 125, leaving behind unfilled region of the trench 135, a tantalum-rich layer 140 may be deposited on top of the transition metal layer 130 and ILD layers 120 of the magnetoresistive stack 500.

Figure 6C:
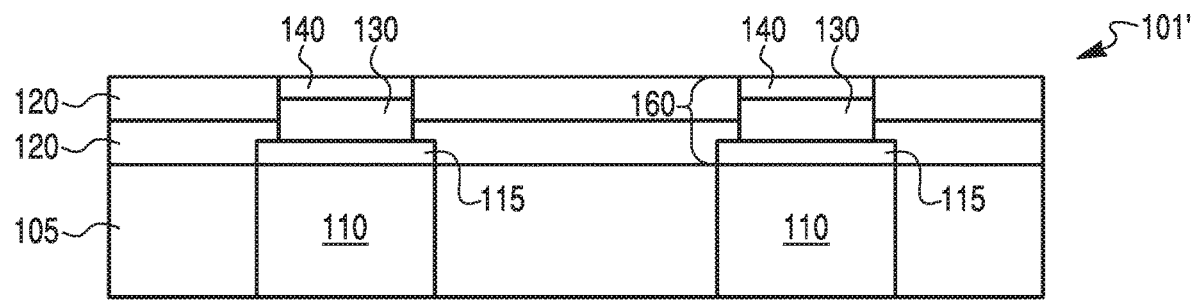

After tantalum-rich layer 140 is deposited within the unfilled region of the trench 135, the portion of tantalum-rich layer 140 over the ILD layers 120, in addition to the portion of layer 140 that extends past the top surface of the top ILD layer 120 (collectively referred to as the "top portion"), may be polished, abraded, or otherwise removed by chemical or physical means, to leave the tantalum-rich layer 140 only within trench 125, as shown in FIG. 6C. In one or more embodiments, the top portion of tantalum-rich layer 140 is removed by CMP or any other suitable process. Thus, with continuing reference to FIG. 6C, the tantalum-rich layer 140 is in contact with the transition metal layer 130 and flush with the top surface of the top ILD layer 120. In one or more embodiments, a cap layer 115, tantalum-rich layer 140, and transition metal layer 130 define a via 160.

Figure 6D:
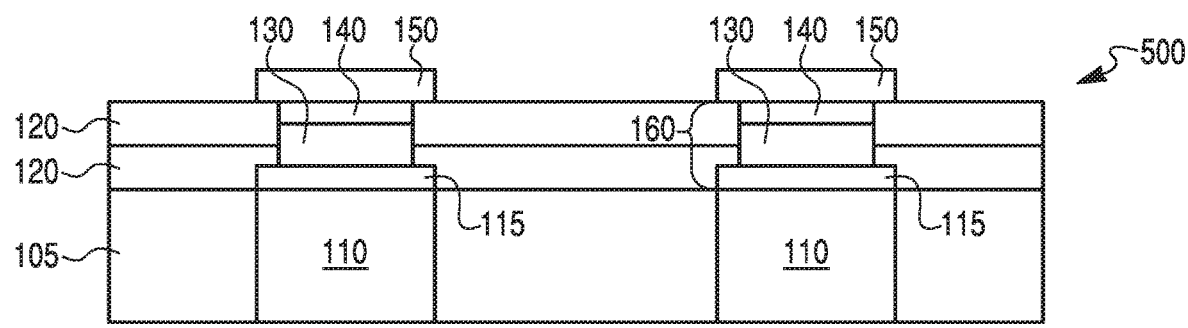

Subsequently, an MTJ 150 may be placed (e.g., deposited and patterned) on tantalum-rich layer 140 of via 160, forming a magnetoresistive stack 500 as shown in FIG. 6D. Current may flow bidirectionally from metal region 110 to MTJ 150 through the via 160 (e.g., through each of the cap layer 115, the transition metal layer 130, and tantalum-rich layer 140). In one or more embodiments, the MTJ 150 have a diameter greater than or equal to the diameter of tantalum-rich layer 140. In other embodiments, MTJ 150 may have a diameter less than the diameter of tantalum-rich layer 140. In some embodiments, MTJ 150 may also contact one or more ILD layers 120.

FIGS. 7A-7B depict another exemplary method for fabricating a via between a metal region 110 and an MTJ 150 from a coated capped substrate 101', according to one or more embodiments of the present disclosure. Referring to FIG. 7A, a transition metal layer 130 may be deposited within trenches 125 of a coated capped substrate 101' (as shown in FIG. 5C). In one or more embodiments, such as the one depicted in FIG. 3A, transition metal layer 130 occupies substantially the entire, or the entire, height and diameter of the trench 125, contacting all ILD layers 120 and associated cap layer 115. Transition metal layer 130 may be deposited such that it has a thickness less than the height of the trench. For example, transition metal layer 130 may be recessed from a top surface of one or more etched ILD layers 120. In some embodiments, transition metal layer 130 is deposited by a selective ALD process.

It should be noted that in some embodiments, transition metal layer 130 may be formed such that it has a thickness greater the height of the formed trenches 125. Portions of transition metal layer 130 that extend above a top surface of one or more etched ILD layers 120 may be removed (e.g., by CMP).

After transition metal layer 130 is deposited in one or more trenches, an MTJ 150 may be applied directly on top of transition metal layer 130 of the magnetoresistive stack 600, as depicted in FIG. 7B. MTJ 150 may have a diameter less than or equal to the diameter of transition metal layer 130. In some embodiments, MTJ 150 may have a diameter greater than or equal to the diameter of transition metal layer 130. Current may pass bidirectionally from MTJ 150 to metal region 110, through transition metal layer 130 and cap layer 115. In embodiments like those depicted in FIG. 7B, the via 160 consists of transition metal layer 130 and cap layer 115.

Figure 8A:
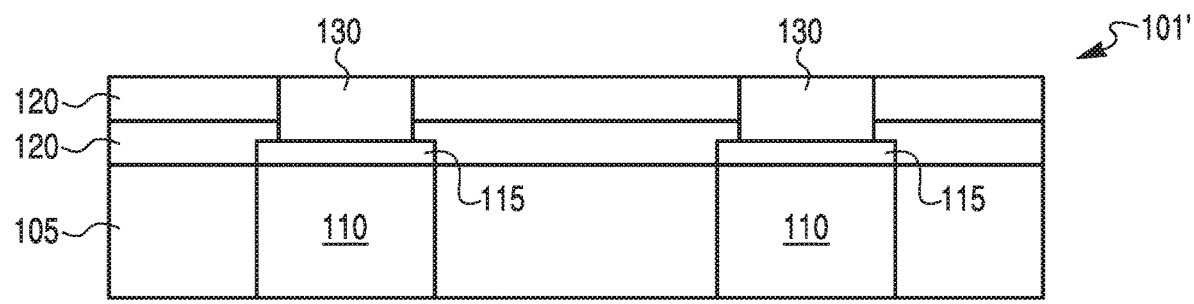
Figure 8B:
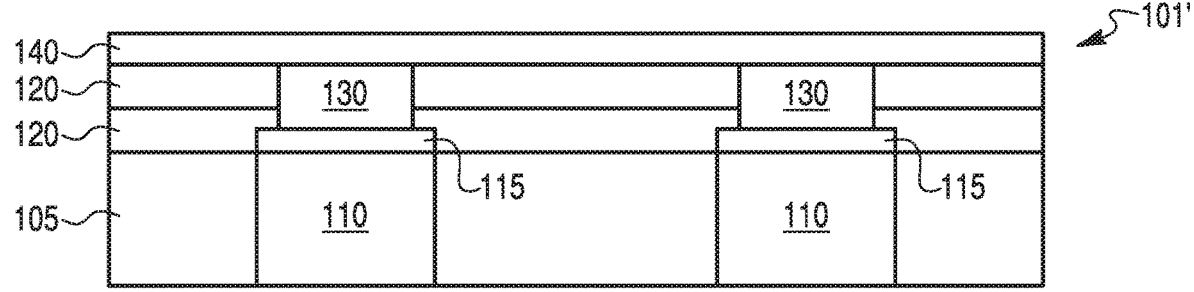
Figure 8C:
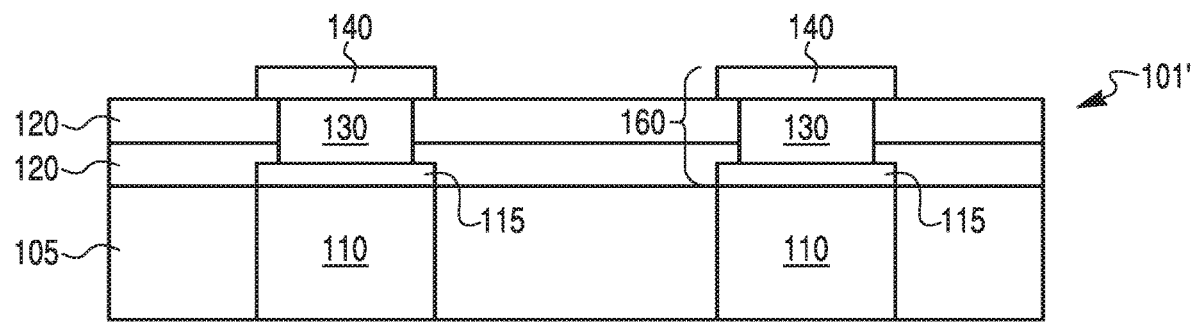

FIGS. 8A-8C depict another exemplary method for fabricating a via between a metal region 110 and an MTJ 150 from a coated capped substrate 101', according to one or more embodiments of the present disclosure. Referring to FIG. 8A, a transition metal layer 130 may be deposited within trenches 125 of a coated capped substrate 101' (as shown in FIG. 5C). In one or more embodiments, such as the one depicted in FIG. 8A, transition metal layer 130 occupies the height and diameter of the trench, contacting all ILD layers 120 and neighboring cap layer 115. In some embodiments, transition metal layer 130 is deposited by ALD (e.g., selective ALD). In some embodiments, the transition metal layer 130 may only occupy a portion of the height of the trench.

After transition metal layer 130 is deposited in one or more trenches 125 of a coated capped substrate 101', a tantalum-rich layer 140 may be selectively applied on top of transition metal layer 130 such that it contacts transition metal layer 130 and one or more ILD layers 120, as shown in FIG. 8B. In some embodiments, though not a requirement, portions of the tantalum-rich layer 140 may be removed from the surfaces of ILD 120. A via 160 is formed comprising cap layer 115, transition metal layer 130, and tantalum-rich layer 140. The via 160 may have a constant diameter or the diameter of the via may vary along a height of the magnetoresistive stack 700. In one or more embodiments, the tantalum-rich layer 140 may have a diameter greater than or equal to the diameter of the transition metal layer 130. In other embodiments, the tantalum-rich layer 140 may have a diameter less than the diameter of the transition metal layer 130.

Figure 8D:
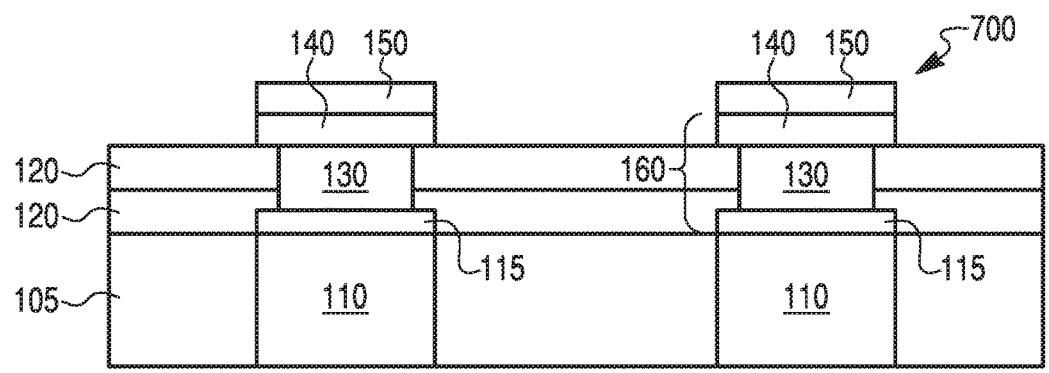

An MTJ 150 may be formed on top of the via 160 (e.g., on top of tantalum-rich layer 140) of a magnetoresistive stack 700 providing a means for current to pass bidirectionally from MTJ 150 to metal region 110, the current passing through the via 160 (e.g., passing through cap layer 115, tantalum-rich layer 140, and transition metal layer 130), as shown in FIG. 8D.

As noted previously, aspects of any embodiments described herein may be combined with any other aspect of any other embodiments, though each combination or permutation of embodiments or aspects may not be specifically mentioned. By way of example and not limitation, in one exemplary embodiment, a transition metal layer 130 comprising ruthenium (Ru) or cobalt (Co) may be deposited by ALD onto a metal region 110 (or cap layer 115) comprising ruthenium (Ru) or cobalt (Co). After the transition metal layer 130 is deposited, the coated (optionally capped) substrate 100', 101' may be cleaned, polished, or otherwise processed. After the coated substrate 100', 101' is cleaned (e.g., by CMP), a tantalum-rich layer 140 may be deposited on the transition metal layer 130. The tantalum-rich layer 140 may then by cleaned, polished, or otherwise processed (e.g., by CMP) and an MTJ 150 may be formed on the tantalum-rich layer 140. In other embodiments, an MTJ 150 is formed on a tantalum-rich layer 140 without prior cleaning polishing, or CMP of the tantalum-rich layer 140. In still other embodiments, an MTJ 150 may be formed directly on the transition metal layer 130, with or without a cleaning, polishing, or other processing step (e.g., CMP) of the transition metal layer 130.

In manufacturing magnetoresistive devices including one or more vias 160 described herein, a set of layers may be deposited on the silica base 105 and then patterned and etched in order to define the electrodes and various layers there between. In order to pattern and etch the layers deposited to form the magnetoresistive devices, the processing tools use alignment marks included on the substrate (e.g., silica base 105) on which one or more magnetoresistive structures or vias 160 may be formed. For example, alignment marks may be used by photolithographic tools for positioning reticles such that the magnetoresistive devices are formed in proper alignment with underlying or overlying features. In some embodiments, alignment marks may be included or formed in layers of material underlying a plurality of layers corresponding to the magnetoresistive devices. In order to expose the alignment marks or prevent the alignment marks from being obscured, different techniques may be employed to ensure the alignment marks are available for future processing steps performed in the manufacturing of the magnetoresistive devices.

In one or more embodiments wherein the alignment marks are positioned near the periphery of the substrate, deposition tool tabs can be employed during the deposition of one or more layers of a magnetoresistive device. Such deposition tool tabs may be positioned based on the location of the alignment marks and selectively prevent deposition of material corresponding to at least a portion of the plurality of layers in a region around an alignment mark (e.g., layers of an alignment mark well or a precursor alignment mark well) may be transparent to one or more lasers used by one or more deposition or alignment tools. In other embodiments, an alignment mark or its surrounding region may be covered by one or more layers opaque to lasers used by one or more deposition or alignment tools. In such embodiments, the one or more opaque layers may be etched or otherwise ablated to expose an alignment mark.

In one or more embodiments, an alignment mark may be deposited on a silica base 105 at the same time as one or more vias 160 (according to embodiments described herein) are formed on the silica base 105. In such embodiments, the processing of an alignment mark with one or more vias 160 saves operating cost, time, and reduces the possibility of errant deposition of one or more subsequent layers. In one or more embodiments, the processing of an alignment mark with one or more vias 160 eliminates an alignment step and allows for faster manufacture of magnetoresistive devices. In some embodiments, the via 160 and the alignment mark are deposited on the same substrate (e.g, the same silica base 105). In other embodiments, the via and the alignment marks are processed on separate substrates within the same deposition tool or instrument. One such exemplary process for forming an alignment mark while forming one or more vias 160 will now be described with reference to FIGS. 9A-16. Although such methods are described in the context of a particular exemplary via 160 described herein, it should be understood that the methods, processes, and techniques described herein are applicable to any of the exemplary vias 160 described in the present disclosure.

Referring to FIGS. 9A-13B, several cross-sectional views of a plurality of layers upon a substrate (e.g., silica base 105) are shown. The cross-sections depicted in the "A" FIGS. represent layers formed above a metal region 110 (e.g., layers of a via 160), while the cross-sections depicted in the "B" FIGS. represent areas of the substrate where an alignment mark is formed. In some embodiments, FIGS. with the same numeral ordination (e.g., FIGS. 9A and 9B), depict different areas of the same substrate (e.g., the same silica base 105). In still other embodiments, FIGS. with the same numeral ordination depict different areas of the same substrate at the same time in the processing or formation of one or more alignment marks, vias 160, or magnetoresistive devices.

With reference now to FIGS. 9A-9B, an exemplary coated substrate is shown after one or more ILD layers 120 have been deposited on silica base 105, as previously described. Similarly, as shown in FIG. 9A, trenches 125 have been etched above one or more metal region 110 having a diameter, $d_1$, as described previously. As shown in FIG. 9B, one or more precursor alignment mark wells 225, having a width, $w_1$, may be etched in the ILD layers 120 above the silica base 105 where an alignment mark may be desired. As previously described, in some embodiments, the trenches 125 may have a diameter, $d_1$, less than or equal to 150 nm. By contrast, the one or more precursor alignment wells 225 may have a width, $w_1$, greater than or equal to 750 nm, greater than or equal to 900 nm, greater than or equal to 1000 nm, greater than or equal to 1150 nm, about 750 nm to about 1150 nm, or less than or equal to 1200 nm. In some embodiments, one or more precursor alignment wells 225 may have an elongated shape, with one dimension substantially larger than the other. This is in contrast to the trenches 125 shown in FIG. 9A which may, in some embodiments, have a substantially circular shape. One or more precursor alignment wells 225 may have a length greater than or equal to 10 microns, greater than or equal to 30 microns, greater than or equal to 50 microns, greater than or equal to 70 microns, or 20 microns to 80 microns. The etching of one or more precursor alignment wells 225 may be performed at the same time or using the same tool as the etching of one or more trenches 125.

Referring now to FIG. 10A, a transition metal layer 130 may be deposited into one or more trenches 125 by ALD (e.g., selective ALD). As shown in FIG. 10B, because the substrate (e.g., silica base 105) does not contain a metal region 110 below the precursor alignment mark well 225, the transition metal layer 130 is not deposited in the precursor alignment mark well 225. Rather, the transition metal layer 130 is only deposited above one or more exposed metal region 110. In some embodiments, selective ALD is used to only deposit a transition metal layer 130 above exposed metal regions 110.

Referring now to FIGS. 11A-11B, after a transition metal layer 130 is selectively applied to one or more metal regions 110, a tantalum-rich layer 140 may be deposited, as previously described. In some embodiments, the deposition of tantalum-rich layer 140 may not have the same selectivity as the deposition of the transition metal layer 130, and therefore tantalum-rich layer 140 may be deposited in one or more alignment mark well precursors 225. In some embodiments, the deposition of tantalum-rich layer 140 may fill the remaining volume of one or more trenches 125 not occupied by transition metal layer 130, but may not fill the entire volume of one or more precursor alignment mark wells 225.

Referring now to FIGS. 12A-12B, after tantalum-rich layer 140 is deposited, CMP may be performed. As described previously, CMP is a method of evening a surface. In some embodiments, CMP may remove all material deposited above the top ILD layer 120.

Referring to FIGS. 13A-13B, after CMP has been performed on the coated substrate, one or more layers may be applied above the tantalum-rich layer 140, as described previously. These layers may include the layers that form an MTJ 150, a top electrode 170, and an interlevel dielectric hard mask (ILD HM) 250. Each of these layers may be deposited in succession above tantalum-rich layer 140. In one or more embodiments, MTJ 150, top electrode 170, and ILD HM 250 are also deposited in one or more precursor alignment mark wells 225. ILD HM 250 may be applied in a pattern above top electrode 170. In some embodiments, ILD HM 250 may be patterned such that regions not overlaid by ILD HM 250 are able to be etched or otherwise ablated. In other embodiments, ILD HM 250 may be patterned such that regions overlaid by ILD HM 250 are prevented from being etched or otherwise ablated. Further processing of the precursor alignment mark well 225 may be required in order to form an alignment mark exposed to be used in the deposition of additional layers above top electrode 170.

The deposition of tantalum-rich layer 140, the layers that form the MTJ 150, the top electrode 170, and the ILD HM 250 within a precursor alignment mark well 225 may form three-dimensional topography visible to one or more tools or instruments used in one or more etching processes. The formed three-dimensional topography may provide guidance to the one or more tools or instruments used in etching processes with regards to an etch location relative to the formed vias 160. In some embodiments, the ILD HM 250 may pinch-off (e.g., detach from the rest of the layers) and lie in one or more precursor alignment mark wells 225. Pinch-off of the ILD HM 250 may not affect the etch of inferior layers as the ILD HM 250 may be transparent to one or more lasers used for etching, deposition, or alignment.

FIG. 14 is a flow chart of a method 800 of fabricating an exemplary via 160 according to the present disclosure. One or more ILD layers 120 may be formed on a substrate 100 comprising one or more metal regions 110 to form a coated substrate 100' (step 810). One or more trenches 125 may then be formed in the ILD layers 120 of the coated substrate 100', 101' according to any etching or ablating process previously described or known in the art (step 820). Forming the one or more trenches 125, may include connected processes including providing a photoresist mask and etching or ablating portions of one or more ILD layers 120. Next, a transition metal layer 130 may be formed in the one or more trenches 125 by selective ALD (step 830). After a transition metal layer 130 is formed an MTJ 150 may be formed above the transition metal layer 130, creating a via 160 between the MTJ 150 and metal region 110 (step 840).

FIG. 15 is a flow chart of a method 900 of fabricating an exemplary via 160, according to the present disclosure. One or more ILD layers 120 may be formed on a substrate 100 comprising one or more metal regions 110 to form a coated substrate 100' (step 910). One or more trenches 125 may then be formed in the ILD layers 120 of the coated substrate 100', 101' according to any etching or ablating process previously described or known in the art (step 920). Next, a transition metal layer 130 may be formed in the one or more trenches 125 by selective ALD (step 930). In some embodiments, metal may be provided into the trenches 125 by a conventional ALD process. In such embodiments, any metal deposited outside of trenches 125 (e.g., on a surface of an ILD layer 120) may be removed by any suitable process (e.g., CMP). After a transition metal layer 130 is formed, a tantalum-rich layer 140 may be deposited above the transition metal layer (step 940). A portion of the tantalum-rich layer 140 may be polished, ablated, or otherwise removed by CMP and/or other chemical or physical processes (step 950). Next, an MTJ 150 may be formed above tantalum-rich layer 140, creating a via 160 between the MTJ 150 and metal region 110 (step 960).

As alluded to above, the magnetoresistive devices of the present disclosure, including one or more vias 160, may be implemented in a sensor architecture or a memory architecture (among other architectures). For example, in a memory configuration, the magnetoresistive devices may be electrically connected to an access transistor and configured to couple or connect to various conductors, which may carry one or more control signals, as shown in FIG. 16. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 17A) or an embedded memory device having a logic therein (e.g., as shown in FIG. 17B), each including MRAM, which, in one embodiment is representative of one or more arrays of MRAM having a plurality of magnetoresistive stacks, according to certain aspects of certain embodiments disclosed herein.

In some embodiments, formation of some or all of the regions of magnetoresistive stacks 200/300/400/500/600/700 may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

Further processing may then be carried out on the magnetoresistive stacks 200/300/400/500/600/700 to form an array of magnetoresistive devices, e.g., a magnetoresistive memory element. This processing may include, for example, depositing one or more encapsulates on the formed magnetoresistive stacks 200/300/400/500/600/700, polishing the encapsulated magnetoresistive stacks 200/300/400/500/600/700 to expose a conductive region of the magnetoresistive stacks 200/300/400/500/600/700, and forming a suitable bit contact structure to electrically connect with the magnetoresistive stacks 200/300/400/500/600/700. By way of example and not limitation, various suitable processing steps are described in U.S. Pat. Nos. 8,790,935; 8,877,522; 9,548,442; and 9,711,566. Since processes to form a magnetoresistive device from the magnetoresistive stacks are well known in the art, they are not discussed in further detail herein.

In some embodiments, a method of manufacturing a magnetic memory element is disclosed. The method may comprise etching through a first portion of at least one ILD layer, depositing a transition metal layer above the at least one metal layer via selective atomic-layer deposition, and forming a magnetoresistive device above the transition metal layer. The etching through a first portion of the at least one ILD layer may expose at least one metal layer. The magnetoresistive device may comprise a fixed magnetic region, a free magnetic region, and an intermediate region disposed between the fixed magnetic region and the free magnetic region.

Various embodiments of the disclosed methods may alternatively or additionally include one or more of the following aspects: forming one or more ILD layers on a substrate comprising the at least one metal layer; removing a portion of the transition metal layer by chemical-mechanical planarization; depositing a tantalum-rich layer above the transition metal layer and removing a portion of the tantalum-rich layer via chemical-mechanical planarization; depositing a cap layer above the at least one metal layer prior to the forming of one or more ILD layers; the transition metal layer may be coaxial to the at least one metal layer, the tantalum-rich layer may be deposited above the etched at least one ILD layer; a portion of the transition metal layer may be disposed above the at least one etched ILD layer; a portion of the transition metal layer disposed above the at least one etched ILD layer may be removed by chemical-mechanical planarization; the tantalum-rich layer may have a diameter greater than a diameter of the transition metal layer; the magnetoresistive device may include a synthetic anti-ferromagnetic structure (SAF); and/or the magnetoresistive device may have a diameter greater than a diameter of the transition metal layer.

In some embodiments, a method of manufacturing a magnetic memory element is disclosed. The method may comprise etching through a first portion of at least one ILD layer, forming a via, and forming a magnetoresistive device above the via. The etching through a first portion of the at least one ILD layer may expose at least one metal layer. Forming a via may include depositing a transition metal layer above the at least one metal layer using atomic-layer deposition, and depositing a tantalum-rich layer above the transition metal layer. The magnetoresistive device may comprise a fixed magnetic region, a free magnetic region, and an intermediate region disposed between the fixed magnetic region and the free magnetic region.

Various embodiments of the disclosed methods may alternatively or additionally include one or more of the following aspects: depositing a cap layer above the at least one metal layer; forming one or more ILD layers on a substrate comprising the at least one metal layer and oxide; removing a portion of the tantalum-rich layer, etching an alignment mark well prior to the deposition of the transition metal layer, wherein the etching of the alignment mark well exposes a portion of the oxide; depositing a tantalum-rich layer, wherein the tantalum-rich layer is in contact with the transition metal layer and the oxide that was exposed by the etching of the alignment mark well; depositing an interlevel dielectric hard mask (ILD HM) above the magnetoresistive device, including in the alignment mark well, wherein the ILD HM deposited in the alignment mark well forms three-dimensional topography detectable by one or more tools or instruments used in one or more etching processes; the via may have a diameter less than or equal to 100 nm; the transition metal layer may be coaxial to the magnetoresistive device and the at least one metal layer; the transition metal layer may comprise ruthenium (Ru), copper (Cu), and cobalt (Co), aluminum (Al), or one or more combinations thereof; etching through a first portion of at least one ILD layer forms a trench having a height, and the height of the trench is greater than a thickness of the transition metal layer; and/or the deposition of the transition metal layer may include depositing transition metal above the at least one metal layer, but not in the alignment mark well.

Although various embodiments of the present disclosure have been illustrated and described in detail, it will be readily apparent to those skilled in the art that various modifications may be made without departing from the present disclosure.

What is claimed is:

1. A method of manufacturing a magnetic memory element, the method comprising:
    etching through a first portion of at least one interlevel dielectric (ILD) layer, wherein the etching through a first portion of the at least one ILD layer exposes at least one metal layer;
    depositing a transition metal layer above the at least one metal layer via selective atomic-layer deposition;
    depositing a tantalum-rich layer above the transition metal layer;
    removing a portion of the tantalum-rich layer by chemical-mechanical planarization; and
    forming a magnetoresistive device above the transition metal layer, wherein the magnetoresistive device comprises:
        a fixed magnetic region;
        a free magnetic region; and
        an intermediate region disposed between the fixed magnetic region and the free magnetic region;
    wherein at least a portion of the transition metal layer is disposed above the at least one etched ILD layer; and
    removing a portion of the tantalum-rich layer by chemical-mechanical planarization includes removing a portion of the transition metal layer disposed above the at least one etched ILD layer.

2. The method of claim 1, further comprising forming one or more ILD layers on a substrate comprising the at least one metal layer.

3. The method of claim 2, further comprising depositing a cap layer above the at least one metal layer prior to the forming of one or more ILD layers.

4. The method of claim 1, further comprising removing a portion of the transition metal layer by chemical-mechanical planarization.

5. The method of claim 1, wherein the tantalum-rich layer has a diameter greater than a diameter of the transition metal layer.

6. The method of claim 1, wherein the magnetoresistive device includes a synthetic anti-ferromagnetic structure.

7. The method of claim 1, wherein the magnetoresistive device has a diameter greater than a diameter of the transition metal layer.

8. The method of claim 1, wherein the transition metal layer comprises aluminum (Al).

9. A method of manufacturing a magnetic memory element, the method comprising:
    etching through a first portion of at least one interlevel dielectric (ILD) layer, wherein the etching exposes at least one metal layer;
    depositing a cap layer above the at least one metal layer;
    forming one or more ILD layers on a substrate, wherein the substrate includes the at least one metal layer and an oxide layer;
    forming a via, wherein forming the via includes:
        depositing a transition metal layer above the at least one metal layer using atomic-layer deposition; and
        depositing a tantalum-rich layer above the transition metal layer; and
    forming a magnetoresistive device above the via, wherein the magnetoresistive device includes:
        a fixed magnetic region;
        a free magnetic region; and
        an intermediate region disposed between the fixed magnetic region and the free magnetic region;
    wherein a diameter of the transition metal layer is less than a diameter of the magnetoresistive device.

10. The method of claim 9, wherein the via has an aspect ratio that is less than or equal to 2.

11. The method of claim 9, wherein the via has a diameter less than or equal to 100 nm.

12. The method of claim 9, further comprising removing a portion of the tantalum-rich layer.

13. The method of claim 9, wherein the transition metal layer comprises aluminum (Al).

14. The method of claim 9, wherein etching through a first portion of at least one ILD layer forms a trench having a height, and the height of the trench is greater than a thickness of the transition metal layer.

15. The method of claim 9, further comprising etching an alignment mark well prior to the deposition of the transition metal layer, wherein the etching of the alignment mark well exposes a portion of the oxide layer.

16. The method of claim 15, wherein the deposition of the transition metal layer includes depositing transition metal above the at least one metal layer, but not in the alignment mark well.

17. The method of claim 15, further comprising depositing a tantalum-rich layer, wherein the tantalum-rich layer is in contact with the transition metal layer and the oxide layer that was exposed by the etching of the alignment mark well.

18. The method of claim 15, further comprising depositing an interlevel dielectric hard mask (ILD HM) above the magnetoresistive device, including within the alignment mark well, wherein the ILD HM deposited within the alignment mark well forms three-dimensional topography detectable by one or more tools or instruments used in one or more etching processes.

19. The method of claim 9, further comprising removing a portion of the transition metal layer by chemical-mechanical planarization.

20. The method of claim 9, wherein the magnetoresistive device includes a synthetic anti-ferromagnetic structure.

* * * * *